(12) United States Patent
Voegeli et al.

(10) Patent No.: US 7,459,367 B2
(45) Date of Patent: Dec. 2, 2008

(54) METHOD OF FORMING A VERTICAL P-N JUNCTION DEVICE

(75) Inventors: Benjamin T. Voegeli, Burlington, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 11/161,239

(22) Filed: Jul. 27, 2005

(65) Prior Publication Data
US 2007/0023811 A1 Feb. 1, 2007

(51) Int. Cl.
*H01L 21/331* (2006.01)
*H01L 21/8222* (2006.01)

(52) U.S. Cl. ............... 438/309; 438/322; 257/E21.371

(58) Field of Classification Search ............... 257/302, 257/E27.112, E29.085, E27.371, E21.358; 438/362, 309, 322
See application file for complete search history.

(56) References Cited

U.S. PATENT DOCUMENTS

| | | | |
|---|---|---|---|
| 4,086,611 A | 4/1978 | Nishizawa et al. | |
| 4,127,863 A | 11/1978 | Kurata | |
| 4,291,325 A | 9/1981 | Sueoka et al. | |
| 4,441,115 A | 4/1984 | Dahlberg | |
| 5,930,635 A * | 7/1999 | Bashir et al. | 438/313 |
| 5,985,708 A * | 11/1999 | Nakagawa et al. | 438/206 |
| 6,043,552 A * | 3/2000 | Miwa | 257/587 |
| 6,169,007 B1 * | 1/2001 | Pinter | 438/320 |
| 6,171,894 B1 * | 1/2001 | Laurens | 438/202 |
| 6,274,892 B1 | 8/2001 | Kub et al. | |
| 6,396,107 B1 * | 5/2002 | Brennan et al. | 257/362 |
| 6,399,990 B1 * | 6/2002 | Brennan et al. | 257/355 |
| 6,410,395 B1 | 6/2002 | Terpstra et al. | |
| 6,521,506 B1 * | 2/2003 | Coolbaugh et al. | 438/379 |
| 6,593,627 B2 * | 7/2003 | Egashira | 257/350 |
| 6,720,637 B2 * | 4/2004 | Voldman | 257/473 |
| 6,770,918 B2 * | 8/2004 | Russ et al. | 257/173 |

(Continued)

OTHER PUBLICATIONS

Horvath, ZS. J. et al., "Vertical Electrical Properties of Al/SIGe/Si Structures," Proc. 37th Int. Conf. of Microelectronics, Devices and Materials, Oct. 10-12, 2001, pp. 143-148.

*Primary Examiner*—Bradley W. Baumeister
*Assistant Examiner*—Igwe U. Anya
(74) *Attorney, Agent, or Firm*—Anthony J. Canale; Hoffman Warnick

(57) ABSTRACT

A P-N junction device and method of forming the same are disclosed. The P-N junction device may include a P-N diode, a PiN diode or a thyristor. The P-N junction device may have a monocrystalline or polycrystalline raised anode. In one embodiment, the P-N junction device results in a raised polycrystalline silicon germanium (SiGe) anode. In another embodiment, the P-N junction device includes a first terminal (anode) including a semiconductor layer positioned above an upper surface of a substrate and a remaining structure positioned in the substrate, the first terminal positioned over an opening in an isolation region; and a second terminal (cathode contact) positioned over the opening in the isolation region adjacent the first terminal. This latter embodiment reduces parasitic resistance and capacitance, and decreases the required size of a cathode implant area since the cathode contact is within the same STI opening as the anode.

10 Claims, 25 Drawing Sheets

U.S. PATENT DOCUMENTS

| | | | |
|---|---|---|---|
| 6,841,829 B1 * | 1/2005 | Vashchenko et al. | 257/362 |
| 6,949,440 B2 * | 9/2005 | Gau | 438/379 |
| 7,119,401 B2 * | 10/2006 | Voldman | 257/362 |
| 2002/0130393 A1 * | 9/2002 | Takayanagi et al. | 257/616 |
| 2003/0047750 A1 * | 3/2003 | Russ et al. | 257/173 |
| 2003/0129802 A1 | 7/2003 | Lanzerotti et al. | |
| 2003/0168701 A1 * | 9/2003 | Voldman | 257/355 |
| 2003/0186516 A1 * | 10/2003 | Notake et al. | 438/478 |
| 2003/0219952 A1 * | 11/2003 | Fujimaki | 438/322 |
| 2003/0222273 A1 * | 12/2003 | Kunz et al. | 257/119 |
| 2004/0121507 A1 | 6/2004 | Bude et al. | |
| 2004/0207051 A1 | 10/2004 | Takizaw | |
| 2005/0101098 A1 * | 5/2005 | Gau | 438/379 |
| 2005/0151223 A1 * | 7/2005 | Voldman | 257/510 |
| 2005/0191911 A1 * | 9/2005 | Greenberg et al. | 439/762 |
| 2005/0230761 A1 * | 10/2005 | Imahashi et al. | 257/370 |
| 2005/0260826 A1 * | 11/2005 | Dupuis et al. | 438/429 |
| 2006/0284278 A1 * | 12/2006 | Min et al. | 257/506 |
| 2007/0013031 A1 * | 1/2007 | Gray et al. | 257/555 |

* cited by examiner

METHOD OF FORMING A VERTICAL P-N JUNCTION DEVICE

BACKGROUND OF THE INVENTION

1. Technical Field

The present invention relates generally to semiconductor fabrication, and more particular, to a P-N junction device and a method of forming same.

2. Related Art

Vertical P-N junction devices are used for various purposes. For example, low capacitance radio frequency (RF) diodes are needed for RF applications, RF switches, phase-lock loop circuits and low capacitance RF electrostatic discharge (ESD) elements. FIG. 1 shows one conventional P-N junction silicon diode 10. In this particular device, a P++ anode 12 is formed below a silicon surface 14 by ion implantation. One shortcoming of these devices is that a high parasitic resistance path is created under the shallow trench isolation (STI) 15 from cathode contact 16 to cathode 18, i.e., N-well/N+ subcollector. Another shortcoming of these devices is that they typically require a large cathode implant area to ensure coverage of the intrinsic anode 12 and all contact regions 16. The large cathode increases parasitic capacitance to substrate 20. FIGS. 2-3 show other P-N junction devices that suffer from the same problems. FIG. 2 shows another conventional P-N diode 40, this time in the form of a silicon germanium (SiGe) P-N diode in which the raised anode 42 covers all of the opening within STI 45. Contact regions 46 are still required in this structure. FIG. 3 shows a conventional PiN diode 60, which is substantially similar to FIG. 2, except that it includes an intrinsic layer 62. PiN diodes and similarly structured photodiodes and high voltage diodes are useful for higher voltage applications, photo-detectors, high speed switches, and ESD elements. Another P-N junction device that suffers from the above problems is a thyristor, which is used for high voltage, switching devices and ESD applications.

In view of the foregoing, there is a need in the art for a solution that addresses the problems of P-N junction devices.

SUMMARY OF THE INVENTION

The invention includes a P-N junction device and method of forming the same. The P-N junction device may include a P-N diode, a PiN diode or a thyristor. The P-N junction device may have a monocrystalline or polycrystalline raised anode. In one embodiment, the P-N junction device results in a raised polycrystalline silicon germanium (SiGe) anode. In another embodiment, the P-N junction device includes a first terminal (anode) including a semiconductor layer positioned above an upper surface of a substrate and a remaining structure positioned in the substrate, the first terminal positioned over an opening in an isolation region; and a second terminal (cathode contact) positioned over the opening in the isolation region adjacent the first terminal. This latter embodiment reduces parasitic resistance and capacitance, and decreases the required size of a cathode implant area since the cathode contact is within the same STI opening as the anode.

A first aspect of the invention is directed to a vertical P-N junction device comprising: a first terminal including a semiconductor layer positioned above an upper surface of a substrate and a remaining structure positioned in the substrate, the first terminal positioned over an opening in an isolation region; and a second terminal positioned over the opening in the isolation region adjacent the first terminal.

A second aspect of the invention includes a method of forming a P-N junction device, the method comprising the steps of: providing a substrate having an opening through an isolation region; implanting a first p-type region in the substrate through the opening; forming a first n-type region in the opening; forming a dielectric over the substrate; forming a polysilicon seed layer over the dielectric; forming a terminal opening to an upper surface of the substrate; growing a silicon germanium semiconductor layer; forming a second p-type region by doping the silicon germanium semiconductor layer p-type; and forming the terminal.

A third aspect of the invention related to a vertical P-N junction device comprising: a raised polycrystalline silicon germanium (SiGe) anode.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

With reference to the accompanying drawings, FIGS. 4-25 illustrate various embodiments of a method of forming a P-N junction device. As will be described, the ultimately formed P-N junction device may take a variety of forms. For example, the P-N junction device may include a P-N diode, a PiN diode or a thyristor. In addition, the P-N junction device may have a monocrystalline or polycrystalline raised anode. In one embodiment, the P-N junction device results in a raised polycrystalline silicon germanium (SiGe) anode. In another embodiment, the P-N junction device includes a first terminal (anode) including a semiconductor layer positioned above an upper surface of a substrate and a remaining structure positioned in the substrate, the first terminal positioned over an opening in an isolation region, and a second terminal (cathode contact) positioned over the opening in the isolation region adjacent the first terminal. This latter embodiment reduces parasitic resistance and capacitance, and decreases the required size of a cathode implant area since the cathode contact is within the same shallow trench isolation (STI) opening as the anode, as will be described further below.

In one embodiment, the method is performed by borrowing steps from a concurrently occurring formation of a complementary metal oxide semiconductor (CMOS) device at another location on the same wafer, and from borrowing steps from a subsequent, but concurrently occurring, formation of a bipolar junction transistor (BJT), i.e., an NPN bipolar transistor. It should be recognized, however, that the steps as delineated in the appended claims may occur separately from the CMOS process and the NPN bipolar process. In addition, as will be apparent to one with skill in the art, a method of forming a P-N junction device may not require all of the steps that will be described below. The description will employ the convention of having the typical CMOS process or NPN bipolar process shown on the left side of the figures separated by a thick vertical sight line from the various embodiments of the method shown on the right side of the figures. It should be recognized, however, that the devices being formed on opposite sides of the thick vertical sight line are located at different locations and isolated from one another. It should also be understood that the devices being formed on the left side will vary within the figures, not just between the CMOS process and NPN bipolar process but also within those processes. For example, the method borrows from NFET and PFET forming steps of the CMOS process.

Figure 1:
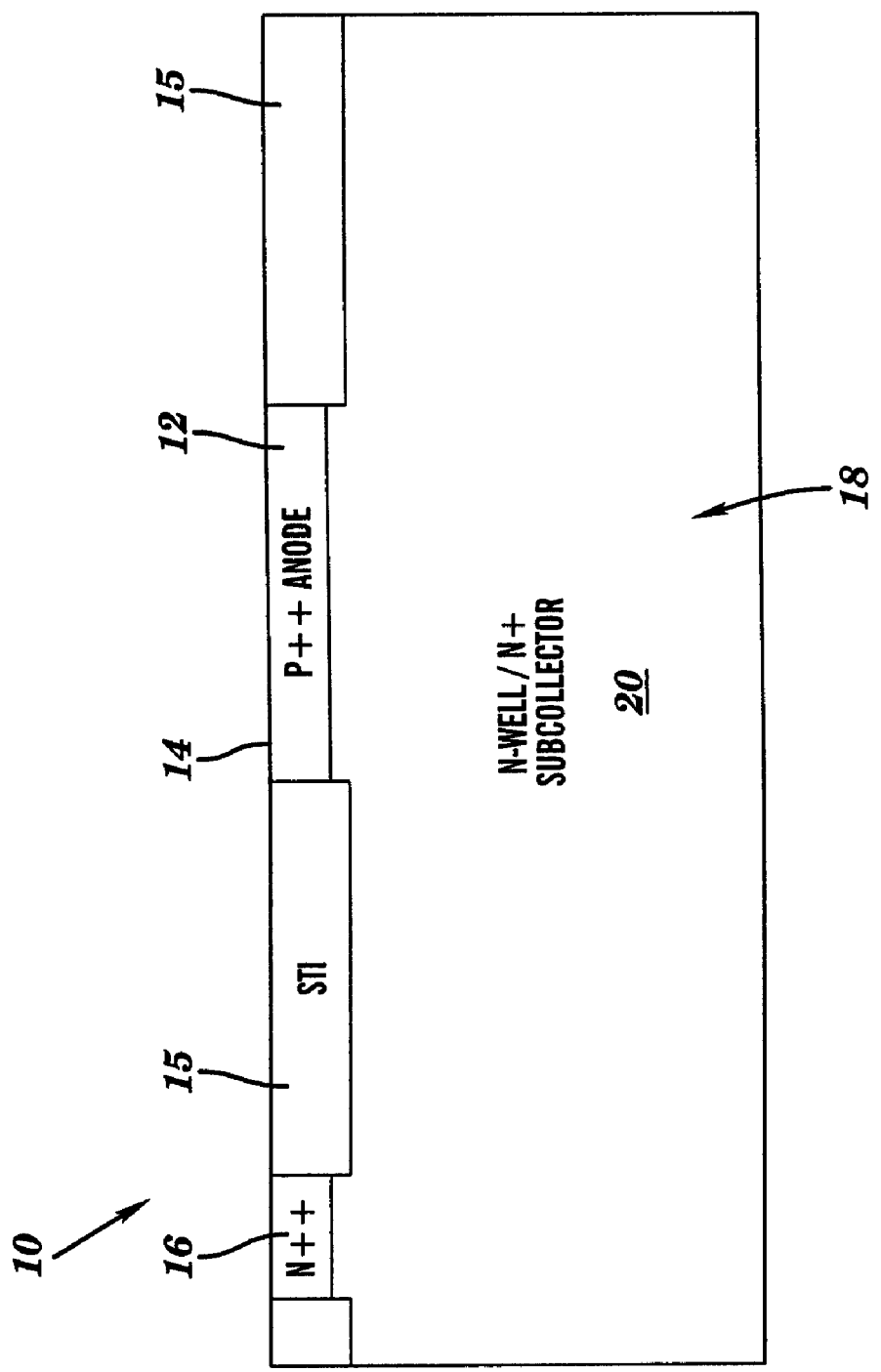
FIGS. 1-3 show conventional P-N junction devices.
Figure 2:
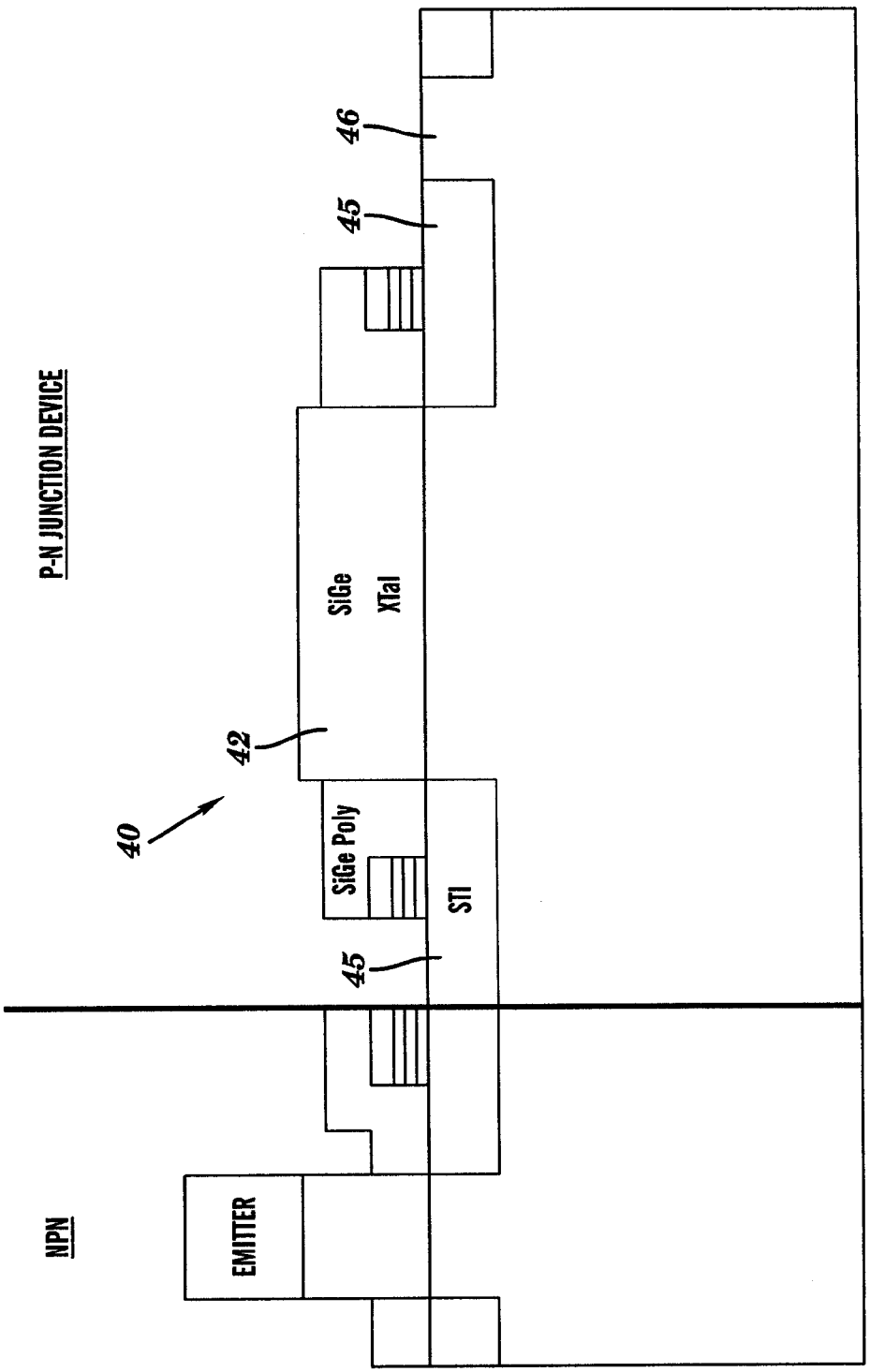
Figure 3:
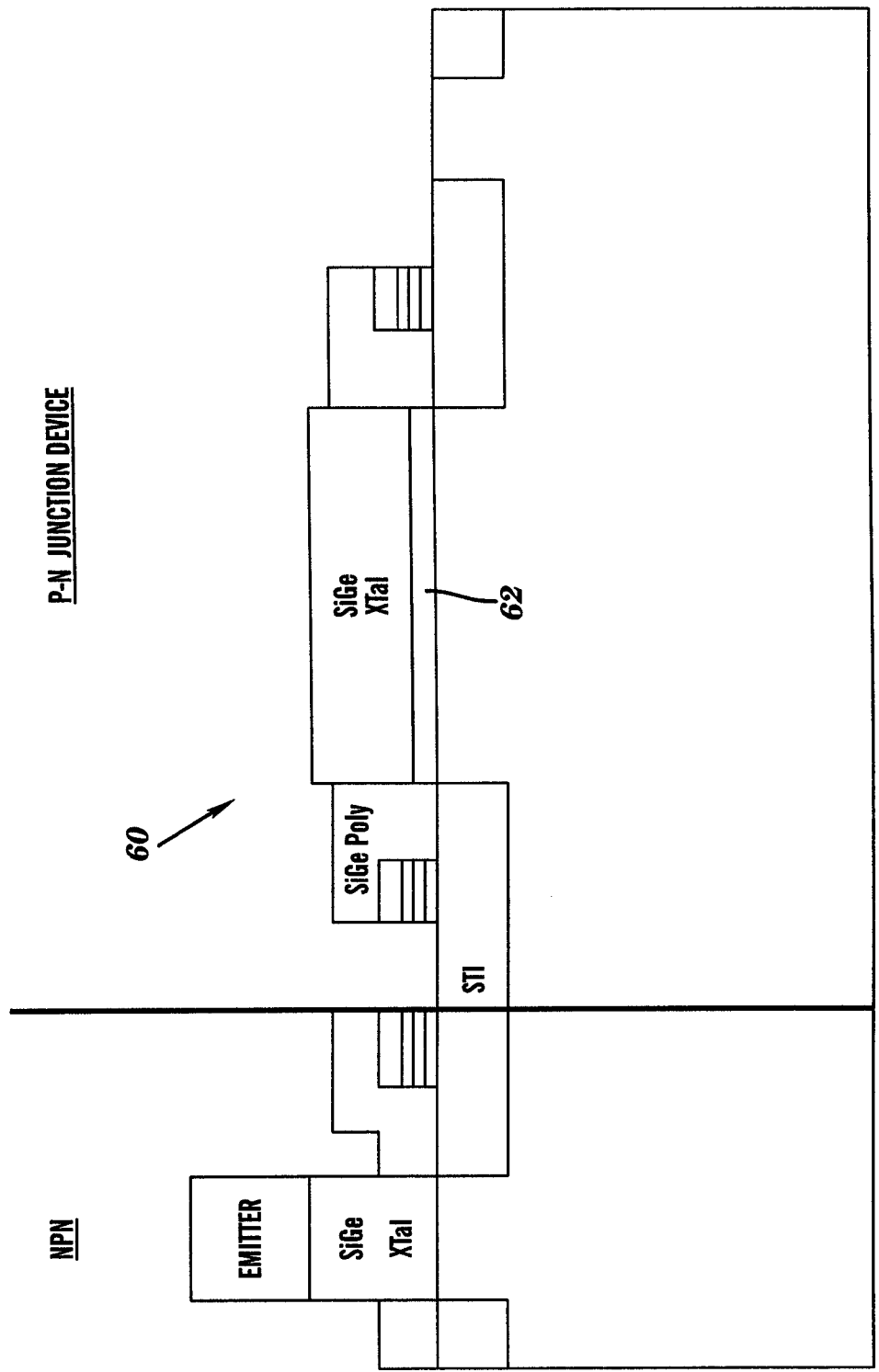
Figure 4:
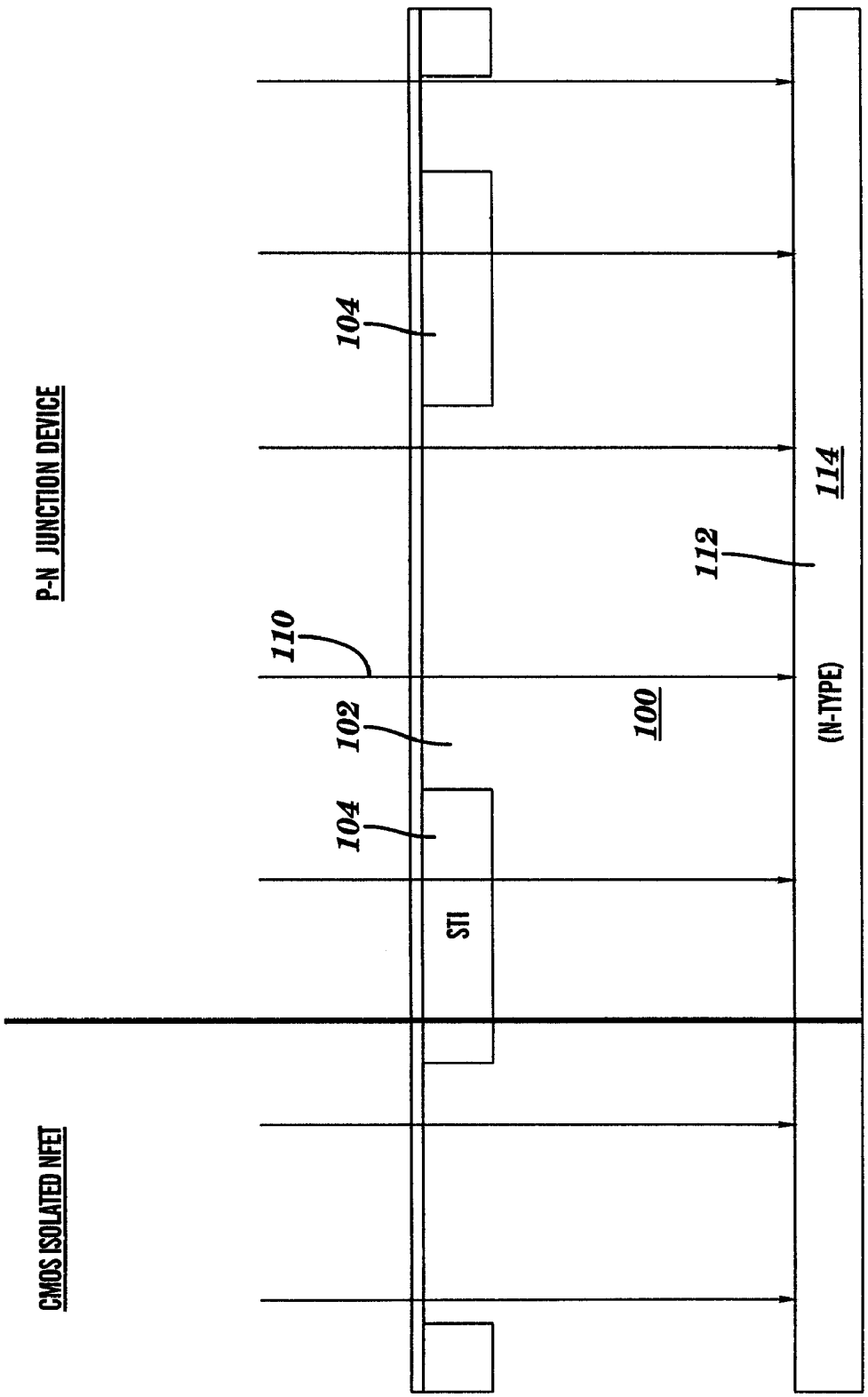
FIGS. 4-16 show a method of forming a P-N junction device according to one embodiment of the invention.

Turning to FIGS. 4-8, steps of the method that may occur concurrently with a CMOS process will now be described. In a first step, shown in FIG. 4, a substrate 100 having an opening 102 through an isolation region 104, e.g., a shallow trench isolation (STI), deep trench isolation etc. (shown as STI only for brevity), is provided. Any conventional processing to attain this structure may be used. FIG. 4 also shows an optional step of implanting 110 n-type material into substrate 100. This implant is required for forming a deep N-well isolation layer 112 for an NFET of the CMOS process location to isolate the NFET p-well from upstream p-well wafers. However, if a thyristor type P-N junction device is desired at the P-N junction device location, an n-type region 114 (cathode) for the thyristor can be formed from N-well isolation layer 112 implant.

Figure 5:
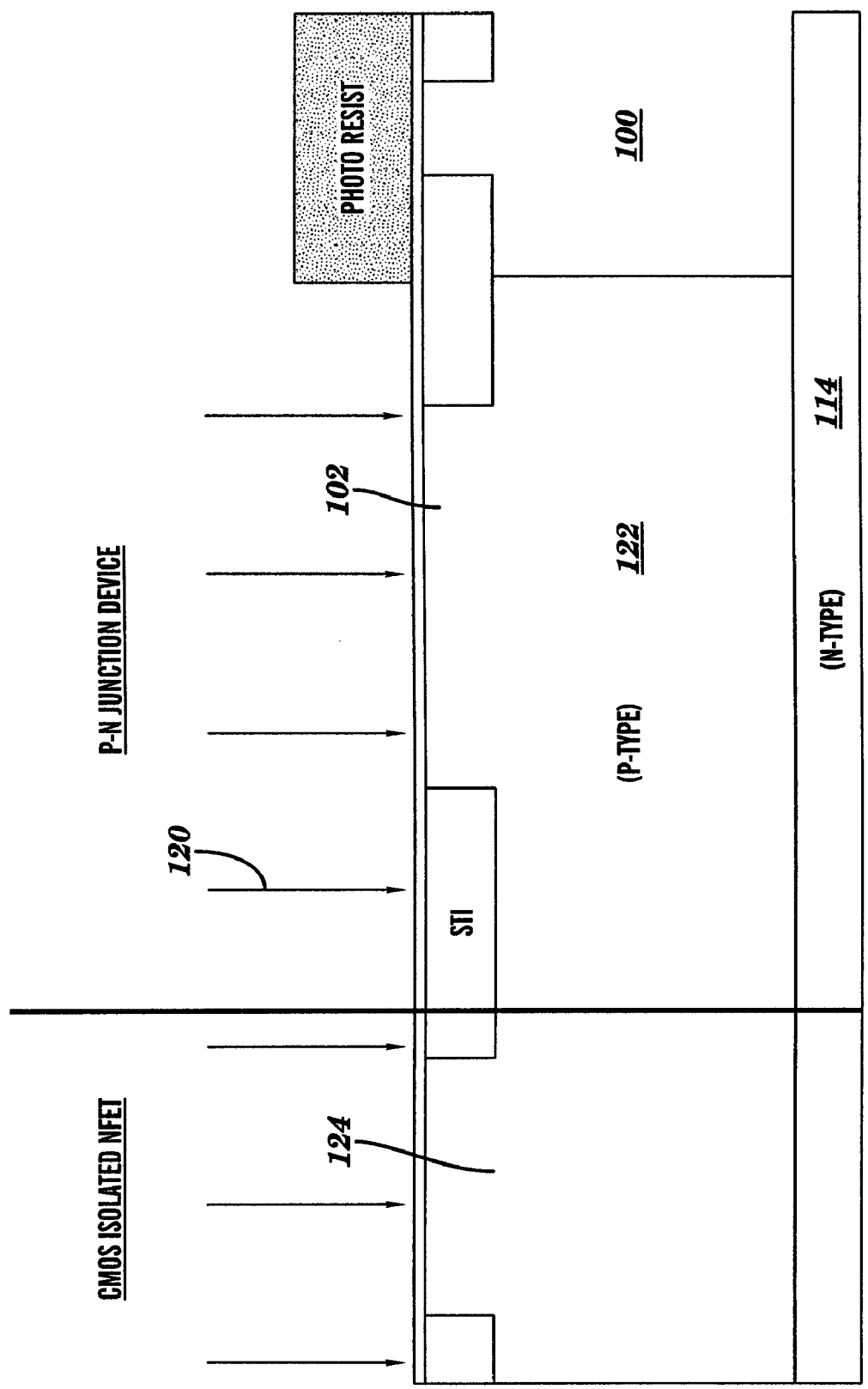

FIG. 5 shows a next step including implanting 120 a first p-type region 122 in substrate 100 through opening 102. In this case, the p-type implant forms the p-well 124 of the NFET device at the CMOS process location and a first, lower p-type region 122 for the P-N junction device. If P-N junction device results in a thyristor, this area may be referred to as a collector region.

Figure 6:
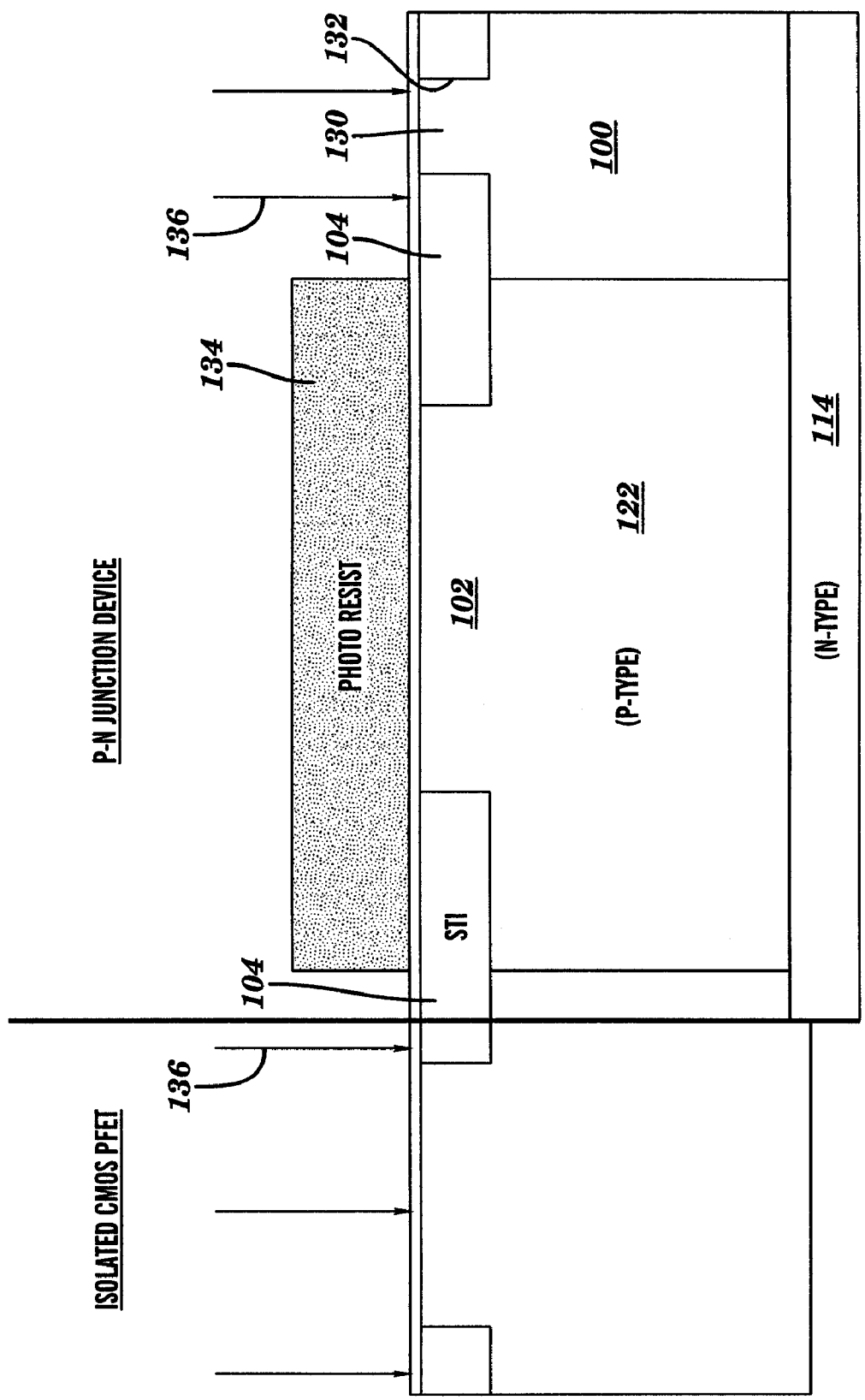

FIG. 6 shows an optional step of forming an N-type reachthrough (contact) 130 for the P-N junction device through a second opening 132 of isolation region. A mask 134 is provided to cover opening 102. This step may occur as part of PFET N-well implant 136. As will be described below, however, formation of an N-type reachthrough 130 may not be necessary for contact of n-type region 114 in all P-N junction devices.

Figure 7:
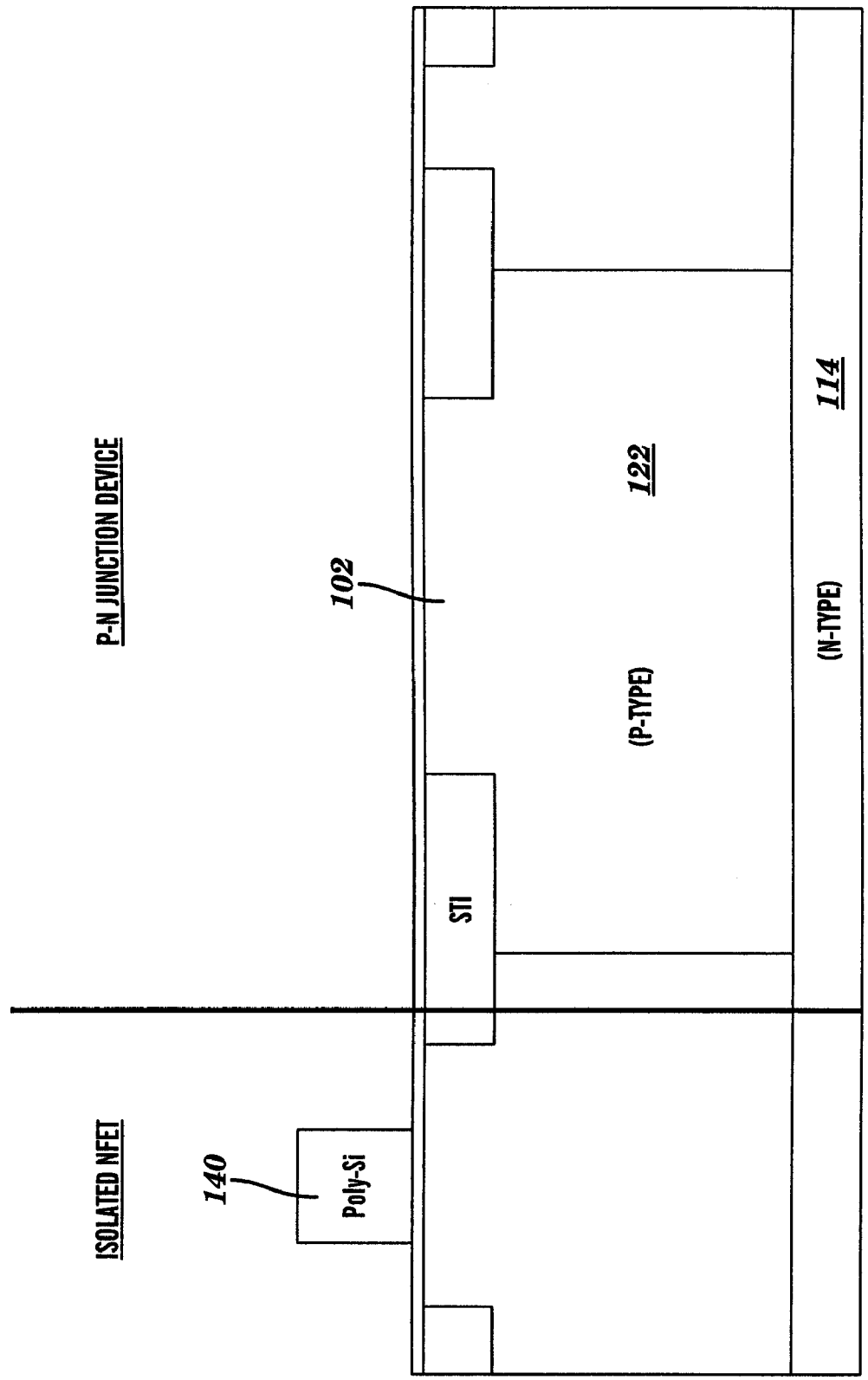

Next, as shown in FIG. 7, a polysilicon gate 140 for an isolated NFET may be formed as part of CMOS processing. This step does not impact the P-N junction device.

Figure 8:
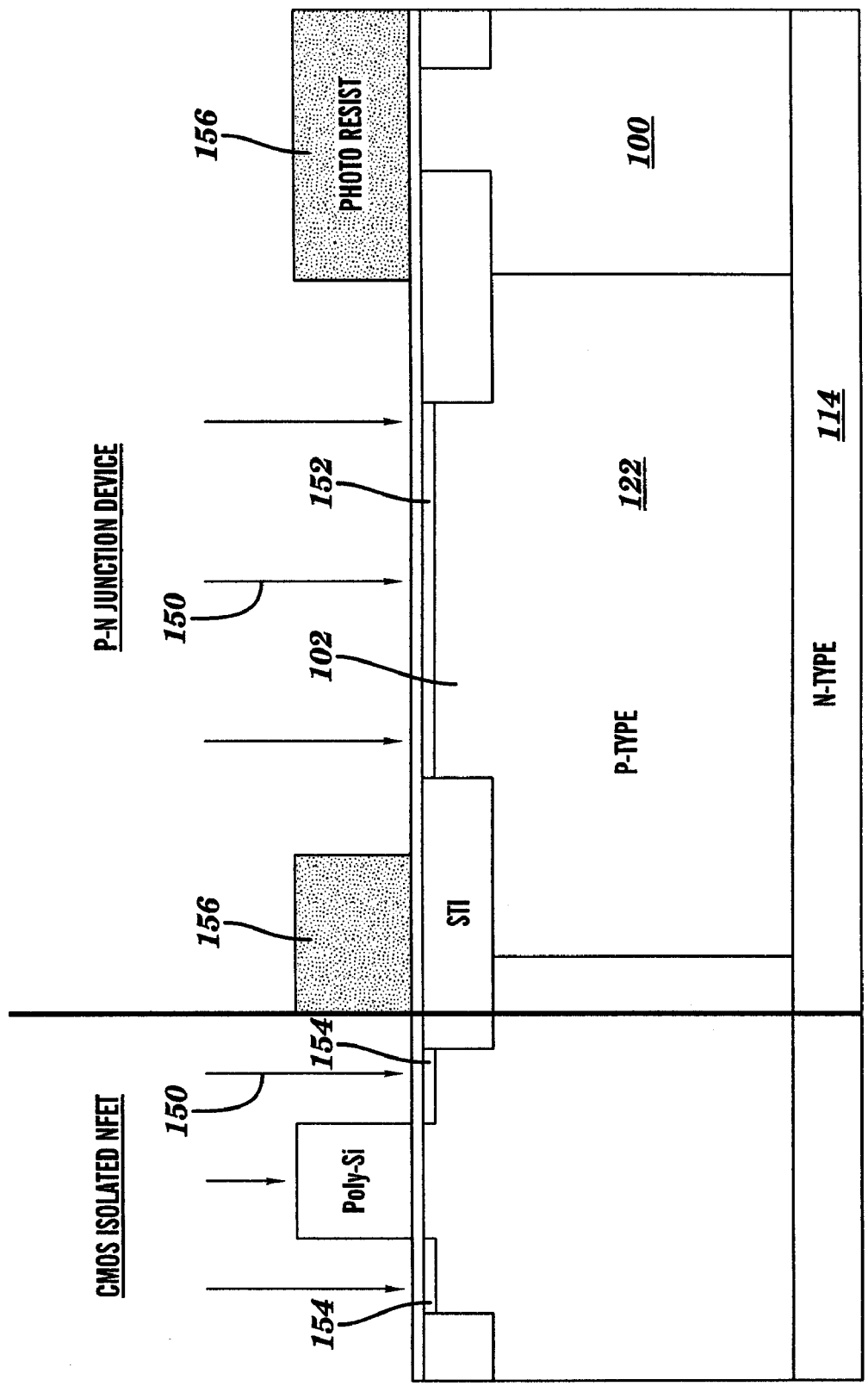

An n-type implant 150 is next, as shown in FIG. 8. This step forms an n-type region 152 for the P-N junction device and an NFET extension 154 for the NFET of the CMOS process side. Any conventional mask 156 may be used to cover areas not to be implanted.

Figure 9:
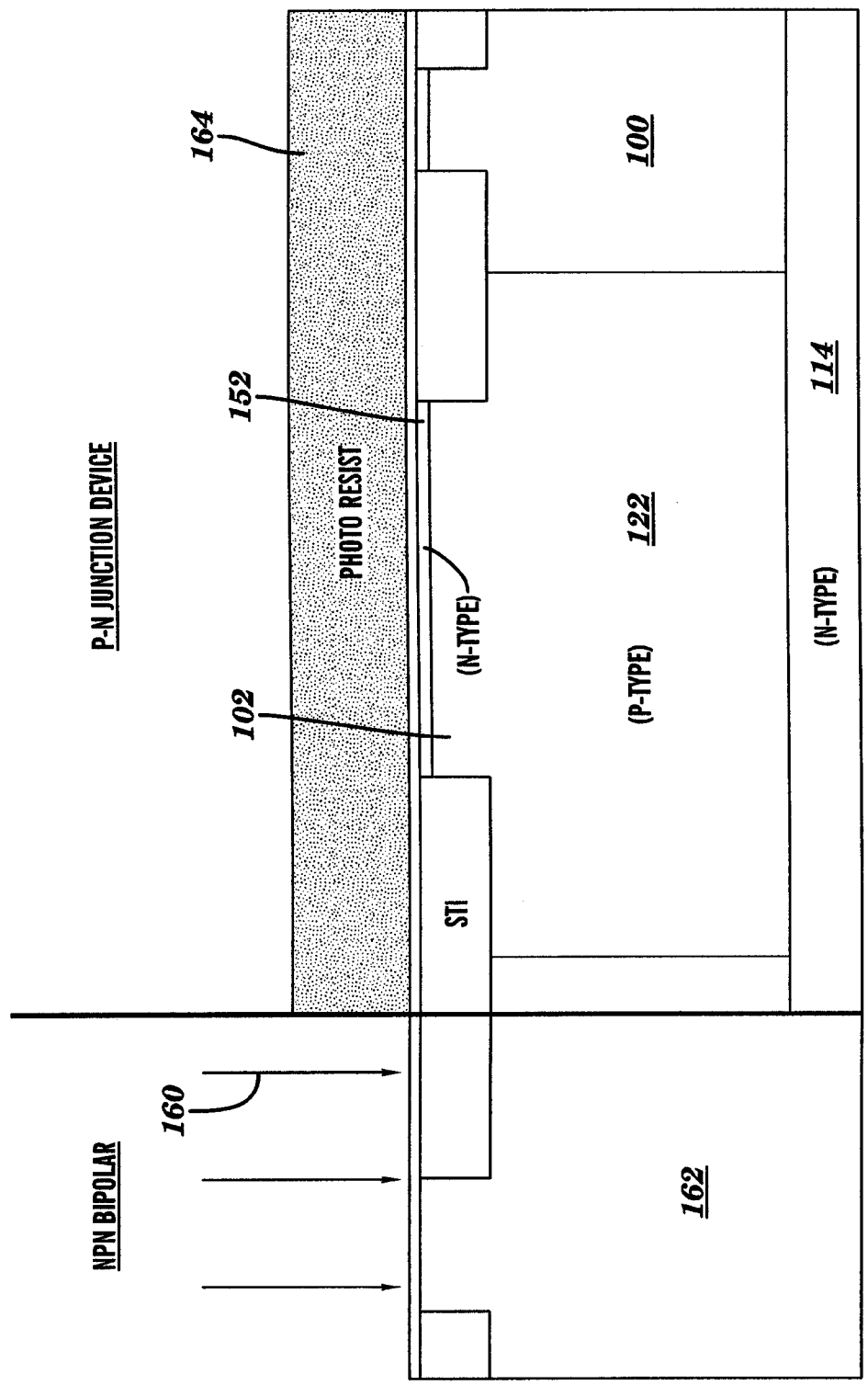
Figure 10:
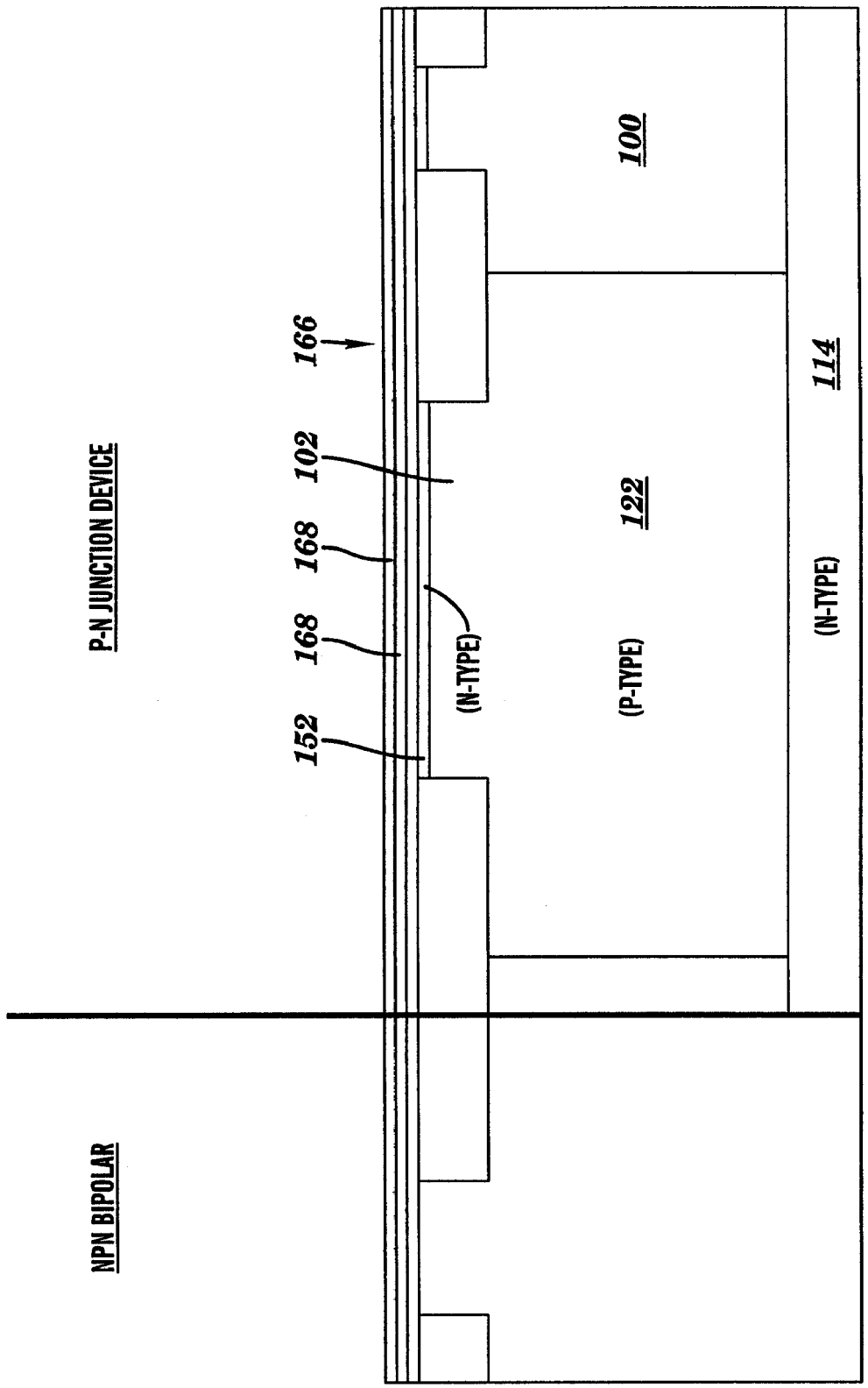

Referring to FIGS. 9-16, borrowing of steps from an NPN bipolar processing is shown. FIG. 9 shows an implant 160 for forming an NPN subcollector 162, which does not impact the P-N junction device since it is covered with mask 164, i.e., this step is not borrowed. FIG. 10 shows a first borrowed step including forming a dielectric 166 over substrate 100, which is typically provided to protect the FETs (not shown) during the NPN bipolar processing. As shown, dielectric 166 may include a number of layers 168. Dielectric layers 168 may include any now known or later developed dielectric materials such as silicon nitride ($Si_3N_4$) or silicon dioxide ($SiO_2$). As will become apparent below, dielectric 166 eventually forms an anode insulator stack.

Figure 11:
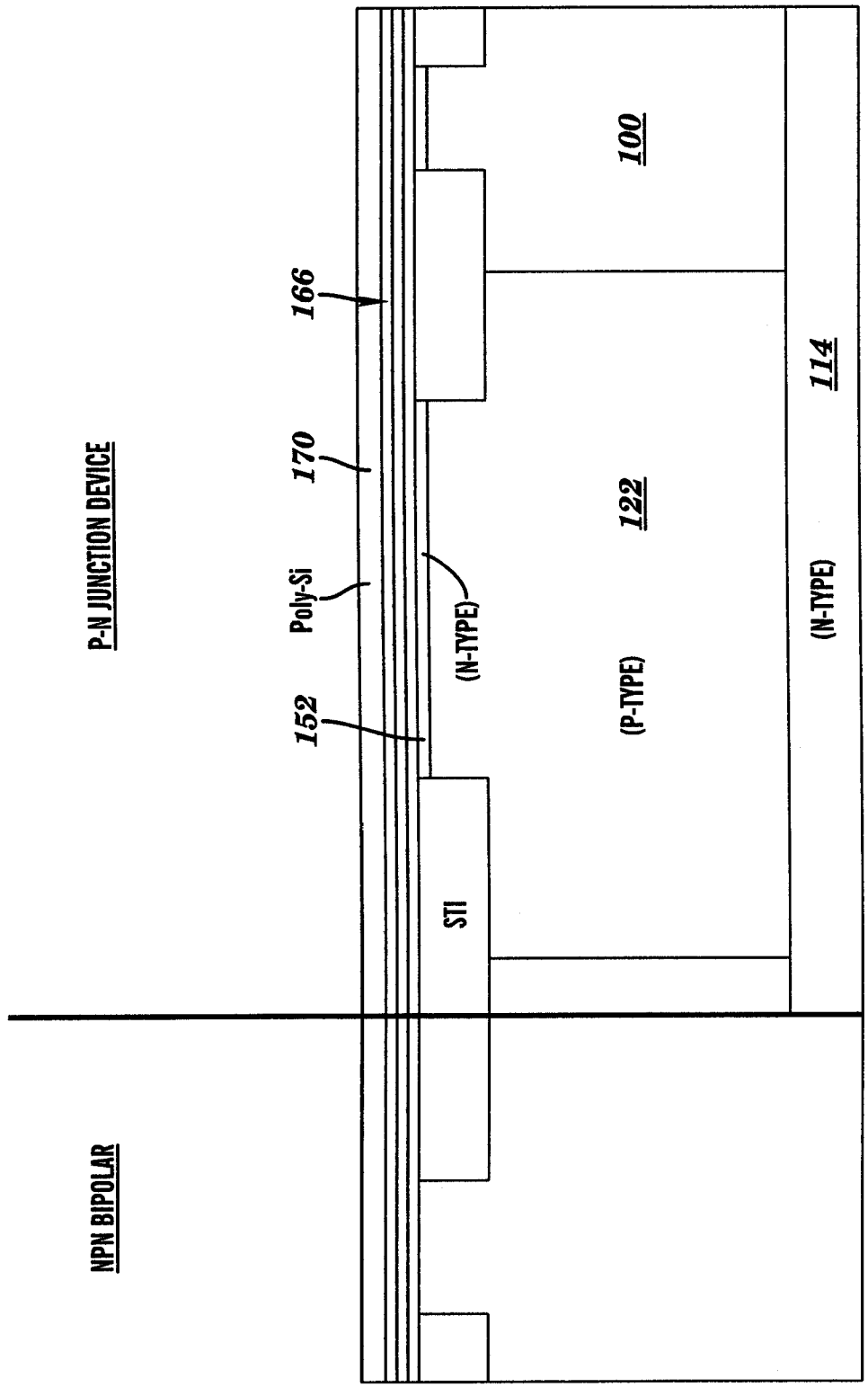

In one embodiment, the next step, as shown in FIG. 11, includes forming a polysilicon seed layer 170 over dielectric 166. This step provides a seed layer for polycrystalline silicon germanium (SiGe) growth in the NPN bipolar process and provides the same material for an anode of the P-N junction device, as will be apparent below.

Figure 12:
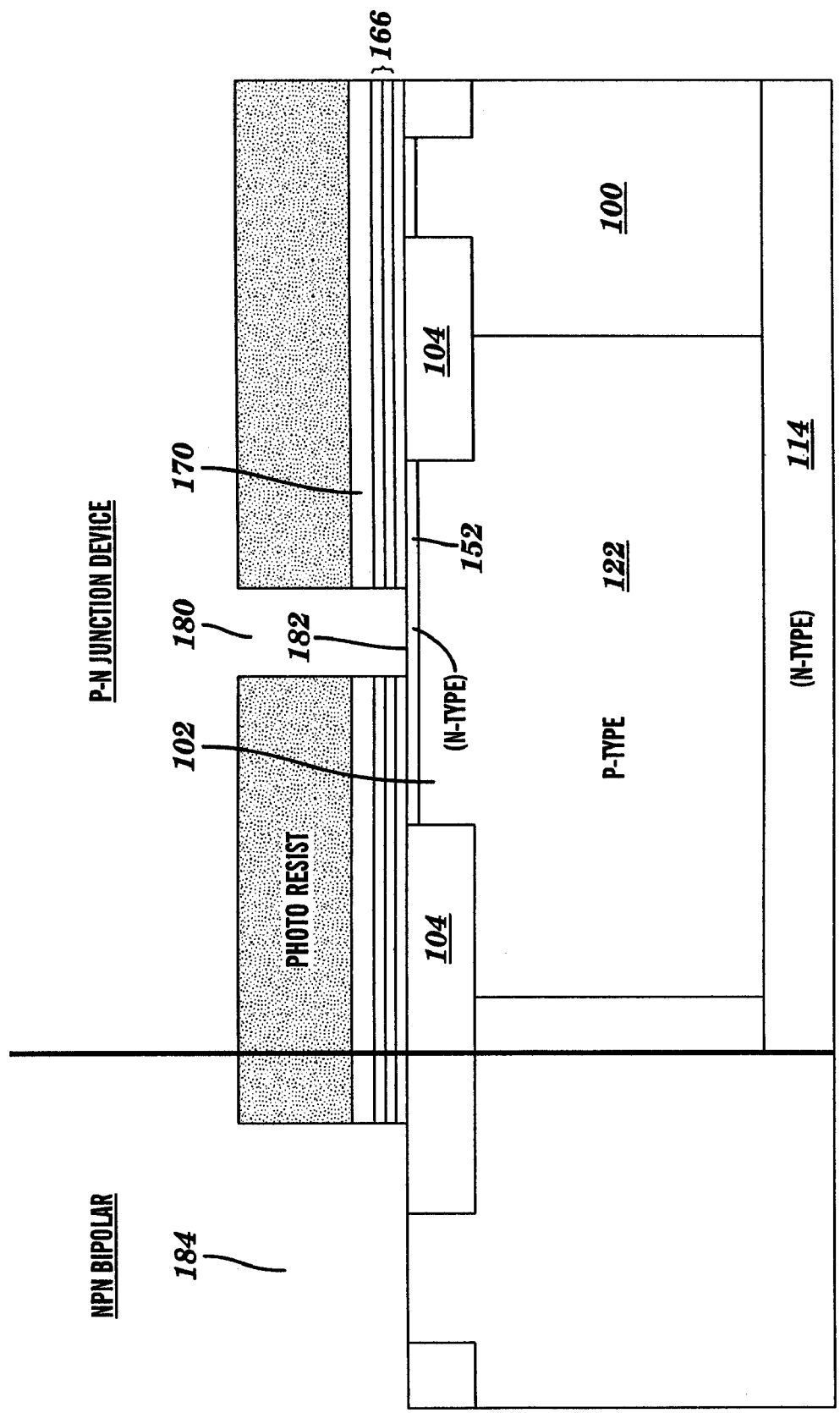

Turning to FIG. 12, a next step includes forming a terminal (anode) opening 180 to an upper surface 182 of substrate 100. This step may be provided as part of an NPN window 184 etching of the NPN bipolar process. As shown, terminal opening 180 extends through dielectric 166 and polysilicon seed layer 170.

Figure 13:
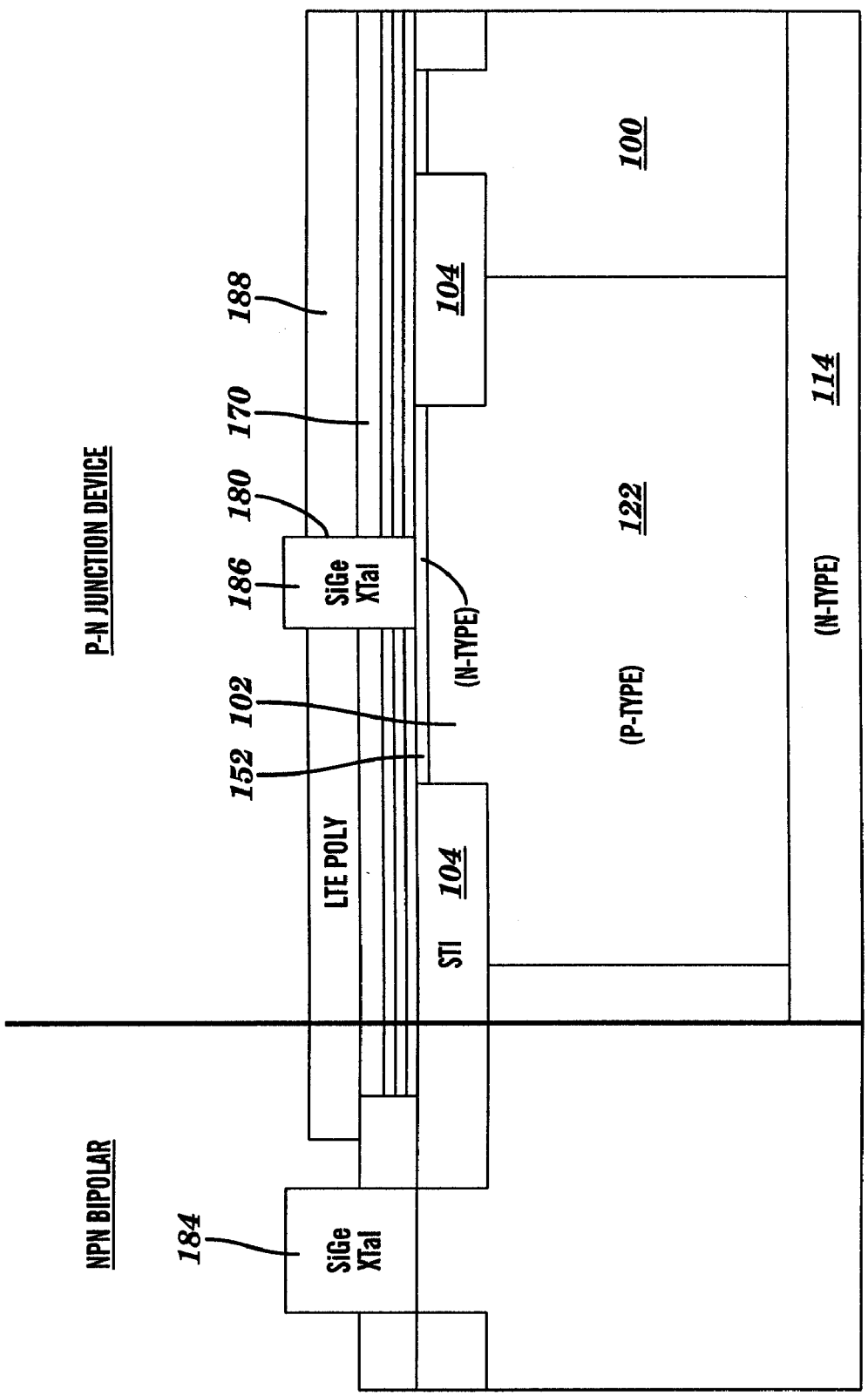

Next, as shown in FIG. 13, a low temperature epitaxial (LTE) growth of silicon germanium (SiGe) is performed. This step results in a monocrystalline SiGe portion 186 (semiconductor layer) in terminal opening 180 and NPN window 184. A polycrystalline silicon germanium (SiGe) semiconductor layer 188 is formed over the exposed portions of polysilicon seed layer 170. As will be apparent later, this step results in a base 200 (FIG. 16) of a bipolar junction transistor (BJT) 600 (FIG. 16) and semiconductor layer 188 of a P-N junction device 602 (FIG. 16) being in the same layer.

Figure 14:
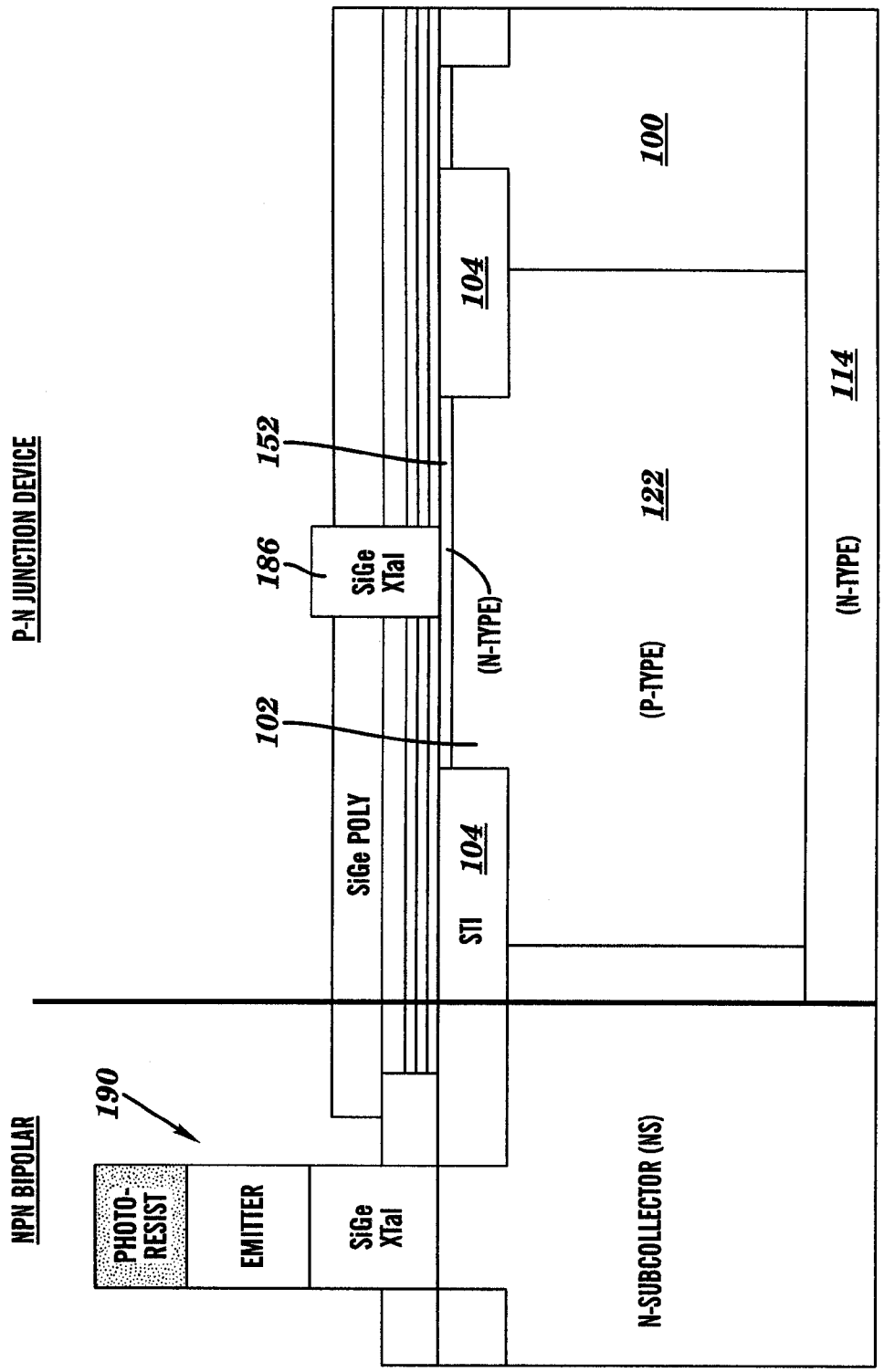

FIG. 14 shows an NPN bipolar processing step of forming a polysilicon emitter 190. This step does not impact the P-N junction device.

Figure 15:
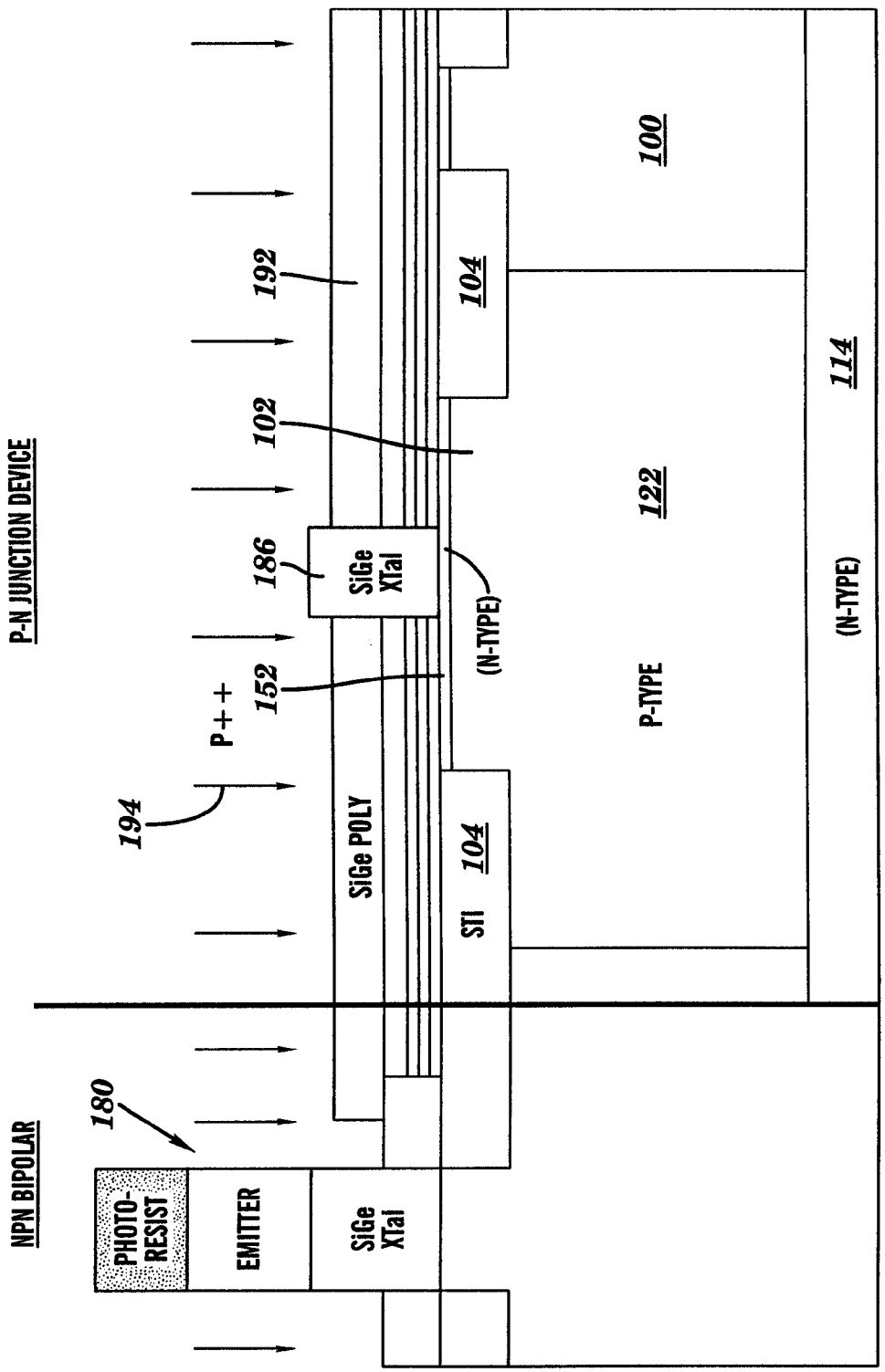
Figure 16:
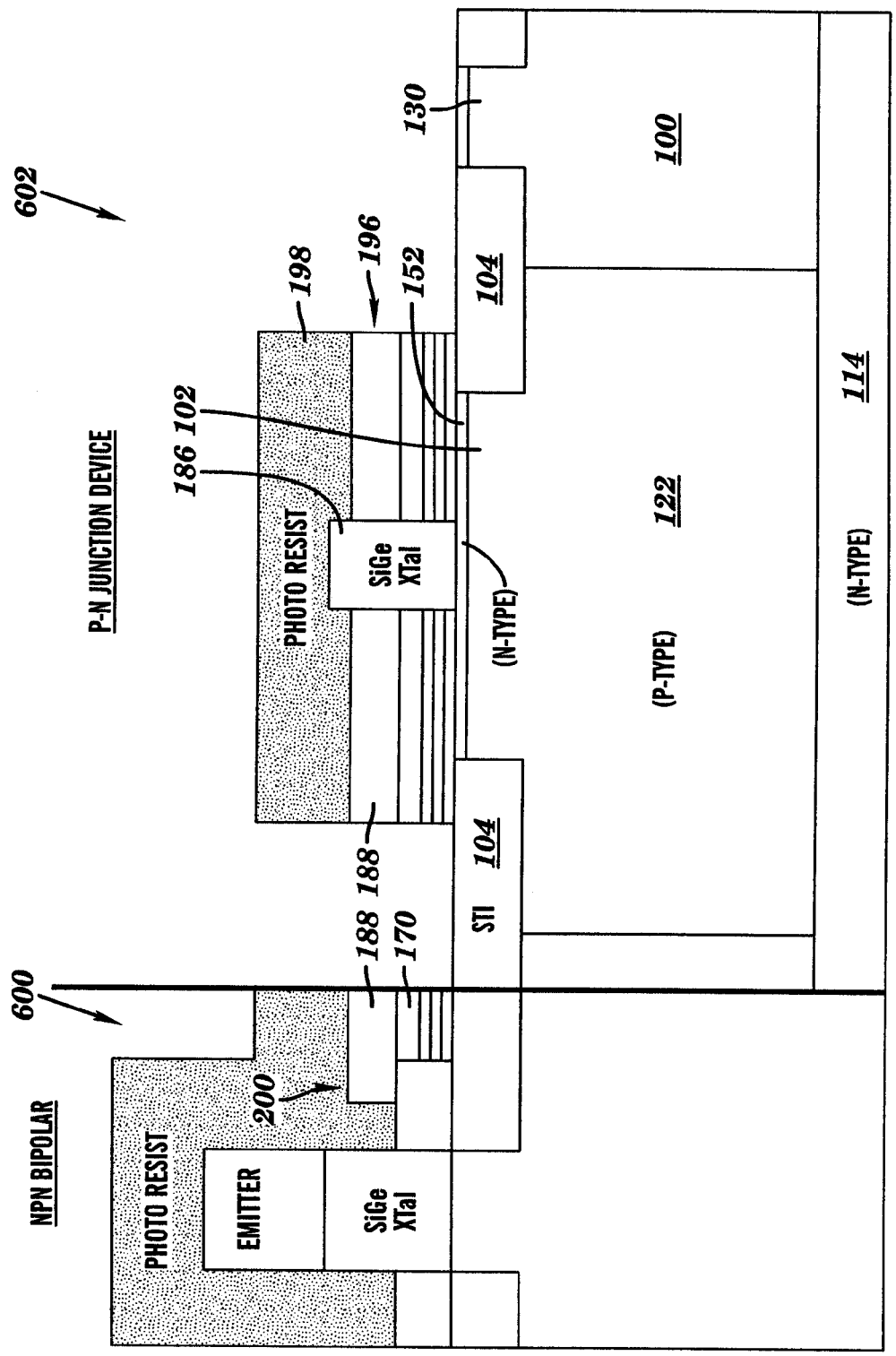
Figure 17:
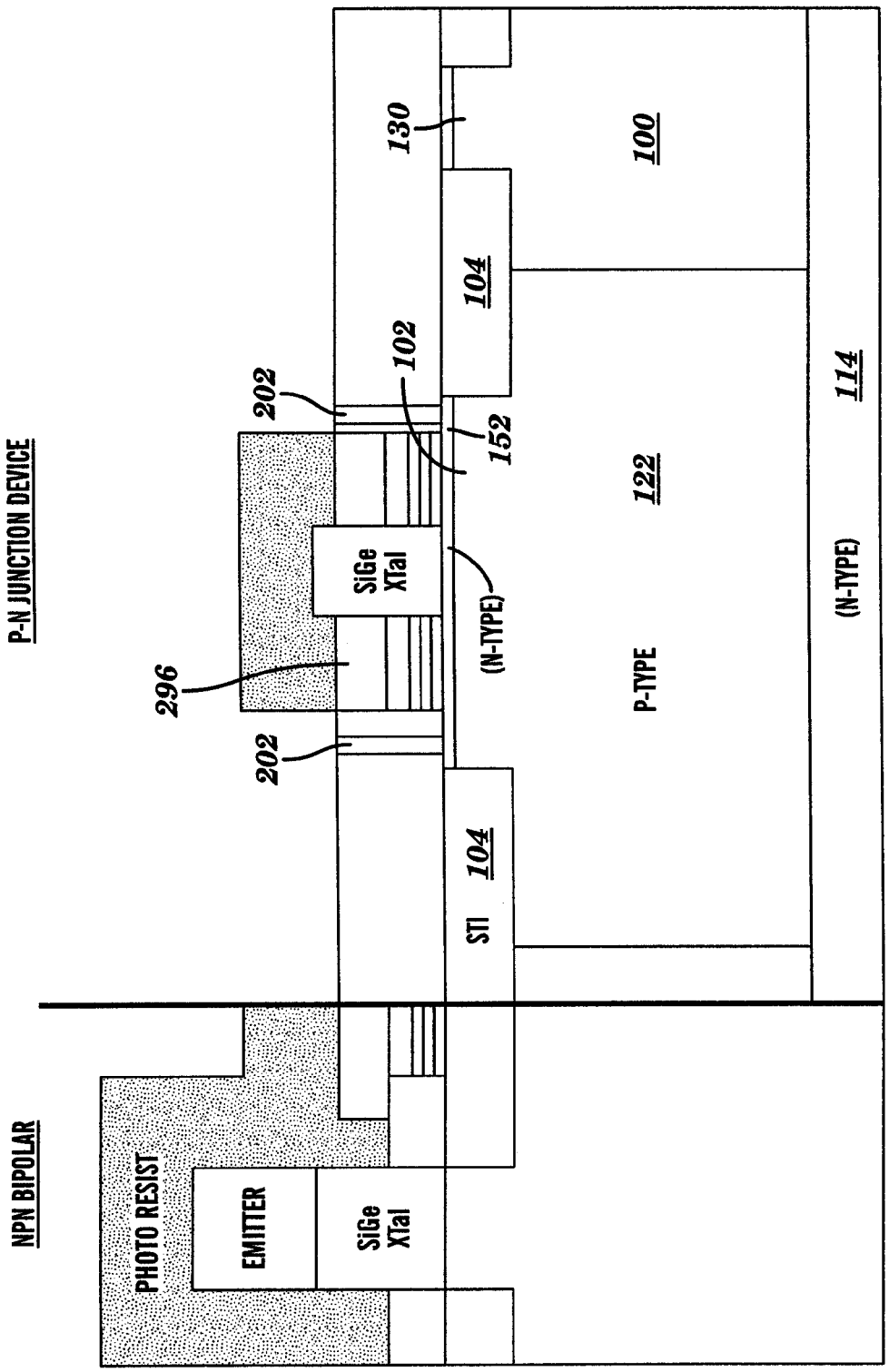
FIG. 17 shows a method of forming a P-N junction device according to a second embodiment of the invention.

Next, as shown in FIG. 15, a second p-type region 192 is formed by doping the silicon germanium p-type (i.e., P++) with an implant 194, hence, doping SiGe portion 186 p-type. As shown in FIG. 16, a terminal (anode) 196 is formed, e.g., by patterning using mask 198 and etching. At the same time, polysilicon seed layer 170 over the NPN bipolar location can be etched to form a base 200 of the NPN bipolar transistor. The resulting structure includes, among other CMOS structures (not shown), a bipolar junction transistor (BJT) 600 and a P-N junction device 602, e.g., a thyristor as shown in FIG. 16. As mentioned above, base 200 of BJT 600 and semiconductor layer 188 of P-N junction device 602 are in the same layer.

As an option to each of the above-described embodiments, p-type region 122 of the thyristor can be directly contacted through another silicon region, isolated by STI, e.g., via a reachthrough (not shown). In this case, a reachthrough region opening would be formed through STI and would be doped p-type.

As shown in FIG. 16, terminal (anode) 196 is formed such that it overlaps opening 102, and hence, isolation region 104. In an alternative embodiment shown in FIG. 17, however, a terminal 296 can be formed (i.e., patterned and etched) to have a size smaller than the isolation region opening 102. In this case, a contact 202 (or a number of them) can be formed in any conventional fashion to contact second (upper) n-type region 152 adjacent to terminal 296 and within isolation region opening 102. As a result, parasitic resistance and capacitance are reduced. In addition, since reachthrough 130 may not be necessary, the size of a cathode implant area, i.e., p-type region 122 and n-type region 114, can be reduced also.

Figure 18:
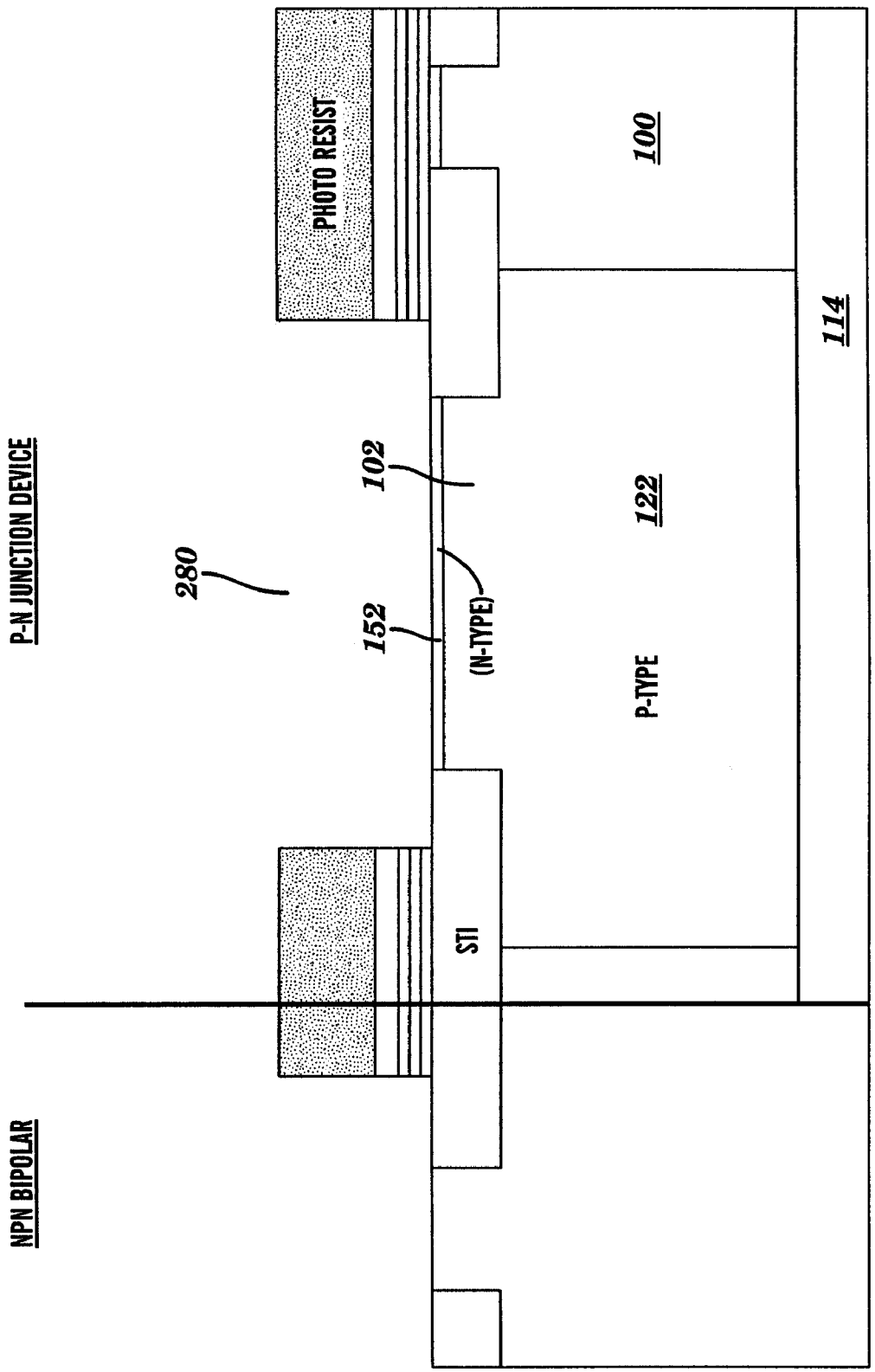
FIGS. 18-19 show a method of forming a P-N junction device according to a third embodiment of the invention.
Figure 19:
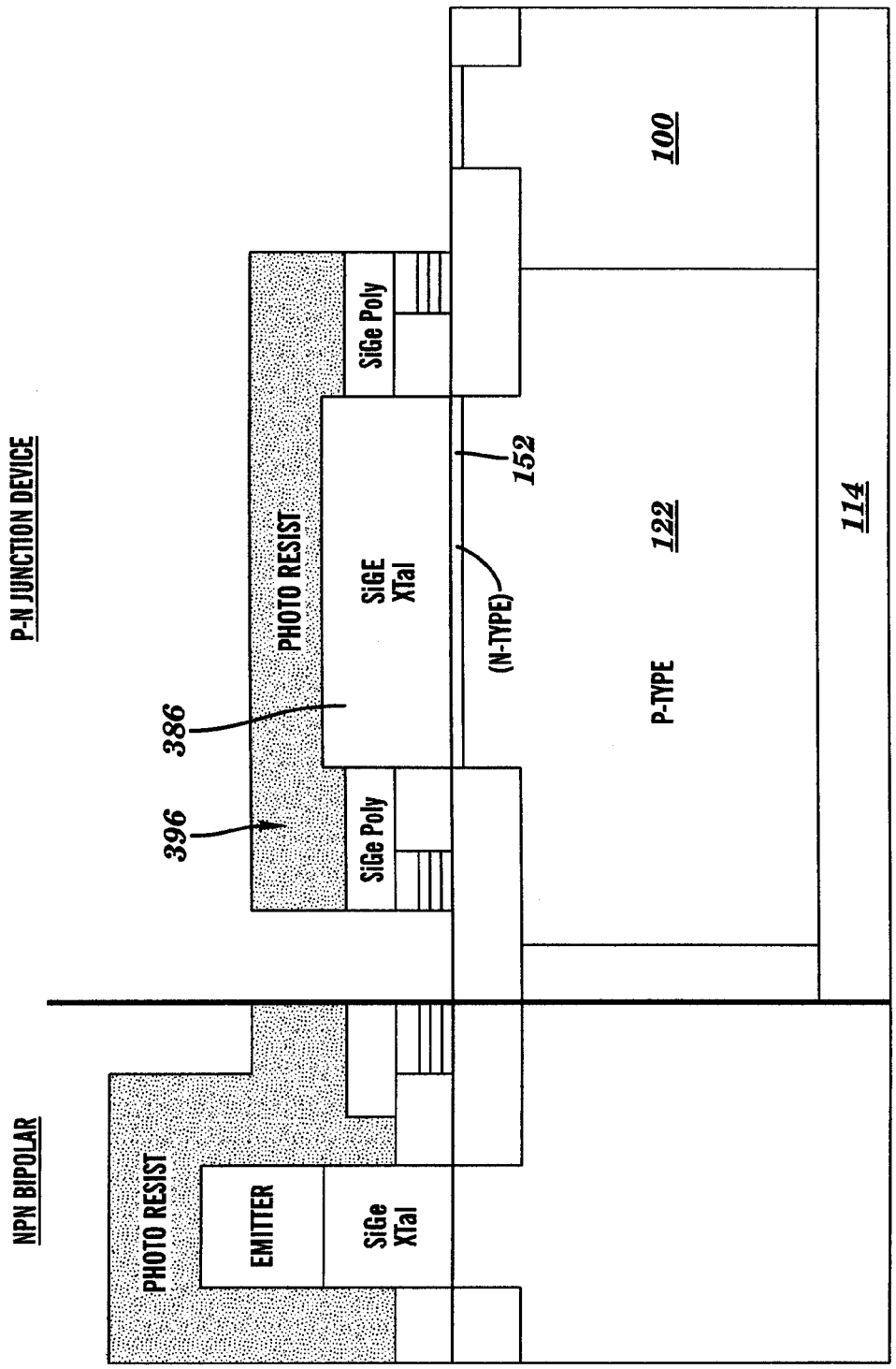
Figure 20:
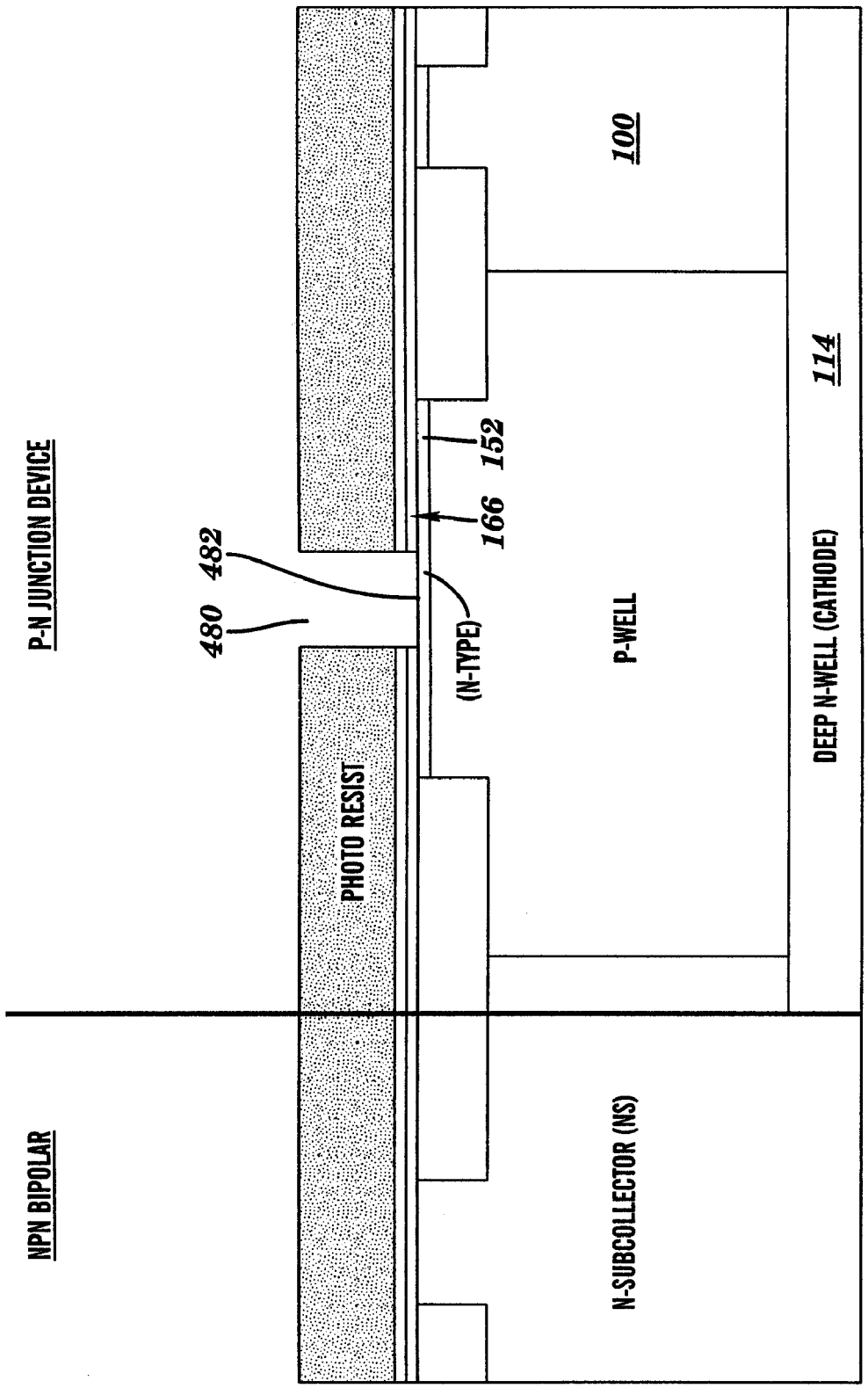
FIGS. 20-22 show a method of forming a P-N junction device according to a fourth embodiment of the invention.

In the embodiment shown in FIGS. 12-16, terminal opening 180 (FIG. 12) is formed smaller than opening 102 in isolation region 104 such that SiGe portion 186 of terminal 196 is monocrystalline within opening 102 of isolation region 104. In an alternative embodiment, shown in FIGS. 18-19, a terminal opening 280 may be formed that is larger than isolation region opening 102. As shown in FIG. 19, this results in a terminal 396 having a monocrystalline SiGe portion 386 that covers opening 102 (FIG. 18).

Figure 21:
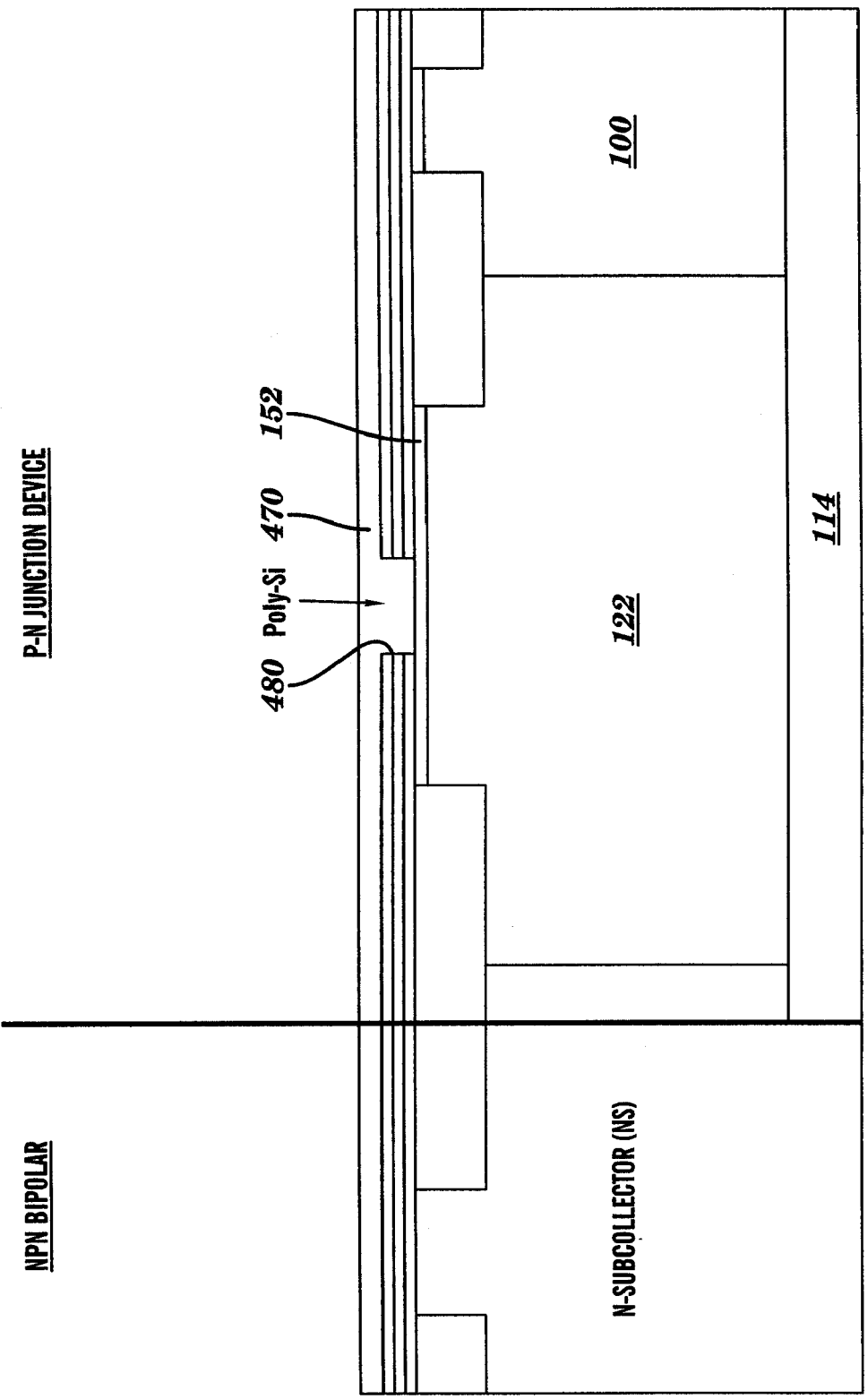
Figure 22:
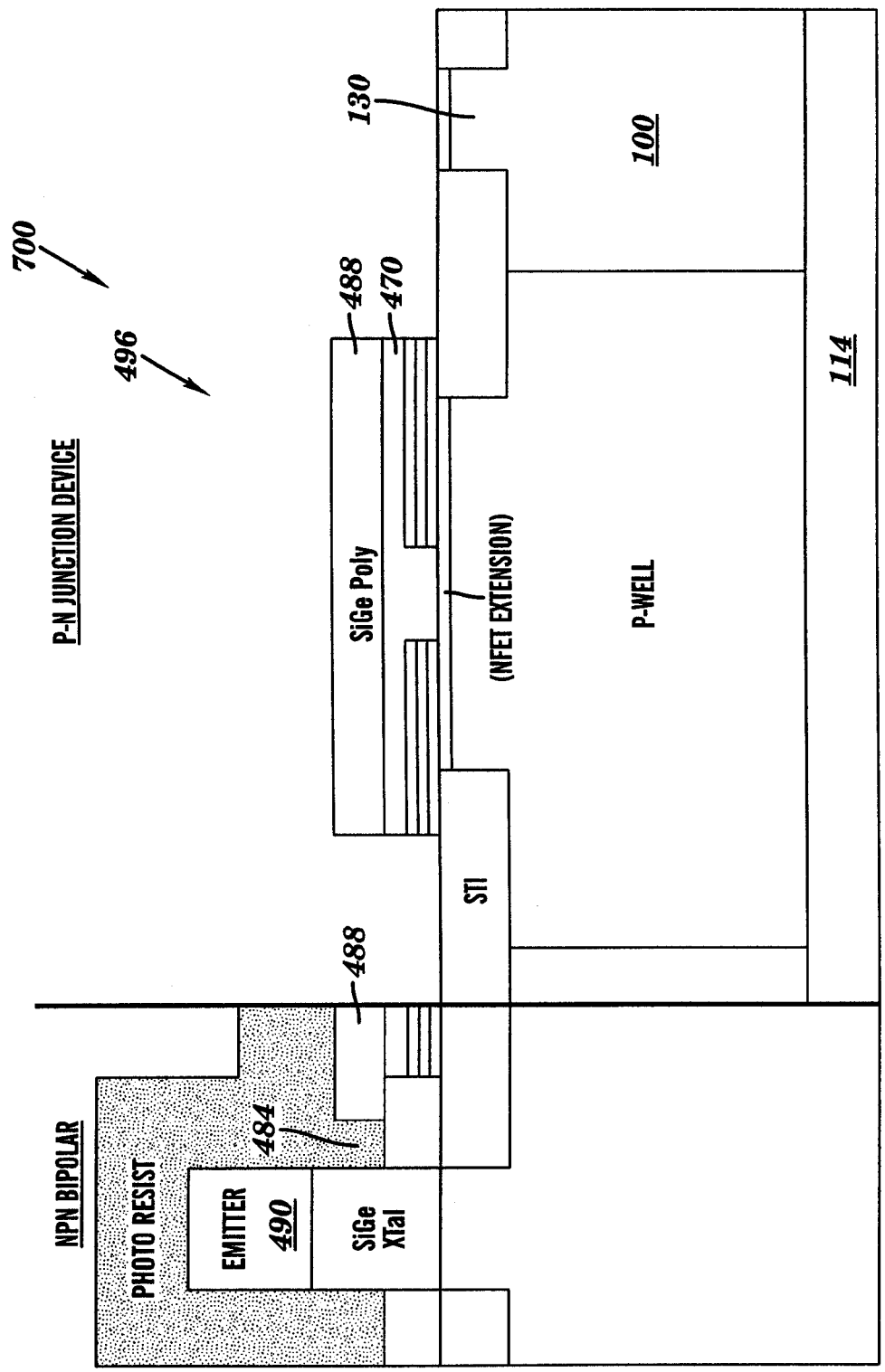

Returning to FIGS. 11-12, in the embodiments described above, polysilicon seed layer 170 was deposited prior to forming terminal opening 180 such that SiGe portion 186 (FIG. 16) of terminal 196 (FIG. 16) (anode) is monocrystalline when formed. In an alternative embodiment, shown in FIGS. 20-22, a terminal opening 480 may be formed to an upper surface 482 of substrate 100 prior to forming a polysilicon seed layer 470 (FIG. 21). As shown in FIG. 21, polysilicon seed layer 470 is then formed such that the polysilicon also enters terminal opening 480. Subsequently, as shown in a compressed format in FIG. 22, processing may proceed similarly to that shown in FIGS. 12-16. That is, an etch window 484 can be formed for NPN bipolar processing, followed by LTE growth of polycrystalline SiGe layer 488 (semiconductor layer for anode and base for NPN) and formation of NPN emitter 490, p-type doping for polycrystalline SiGe layer 488 and, finally, formation of a terminal (anode) 496, as shown in FIG. 22. The result of the above-described alternative embodiment is a vertical P-N junction device 700 including a raised polycrystalline SiGe anode 496.

Figure 23:
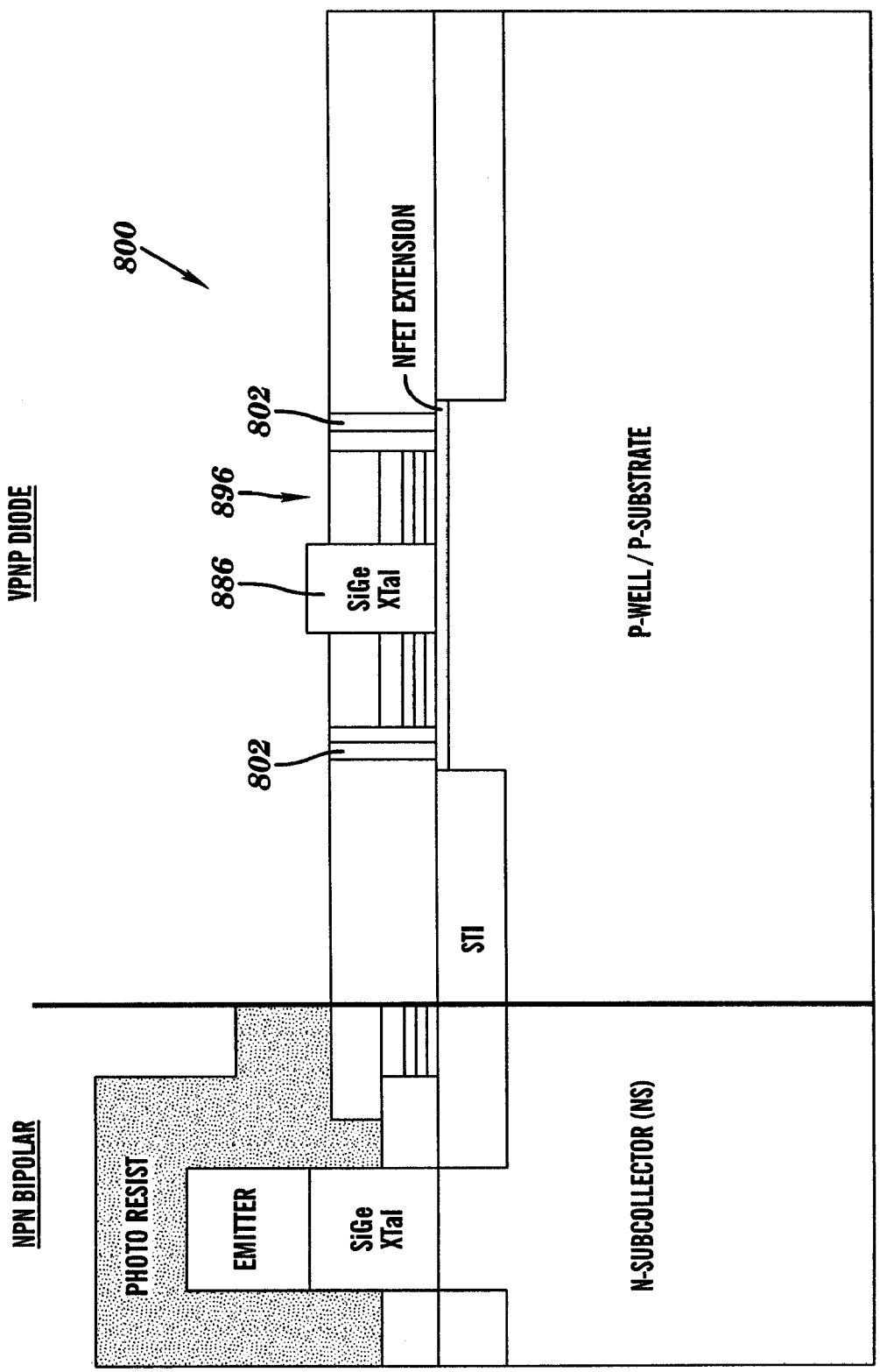
FIGS. 23-25 show methods of forming a P-N junction device according to alternative embodiments of the invention.
Figure 24:
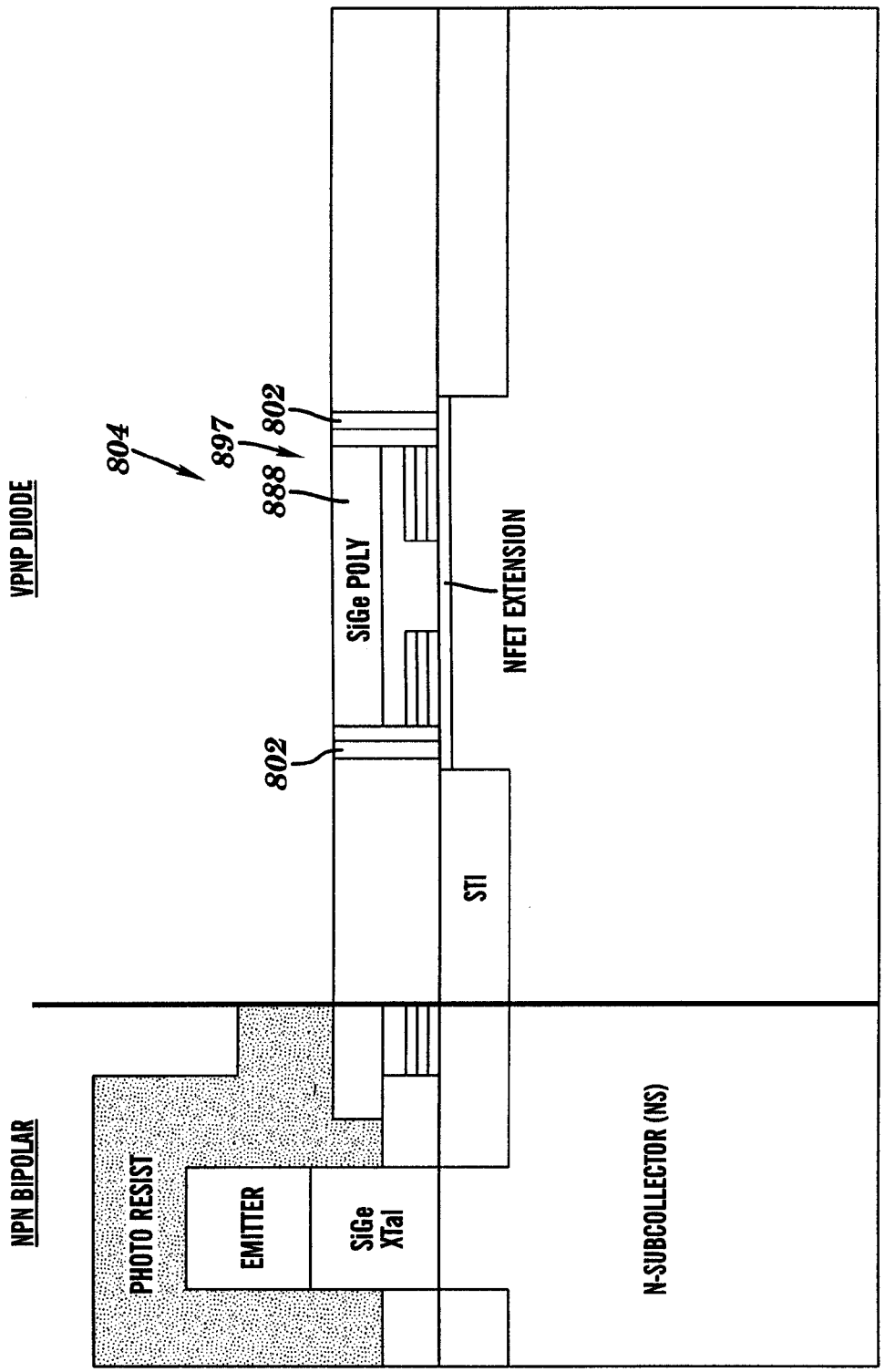
Figure 25:
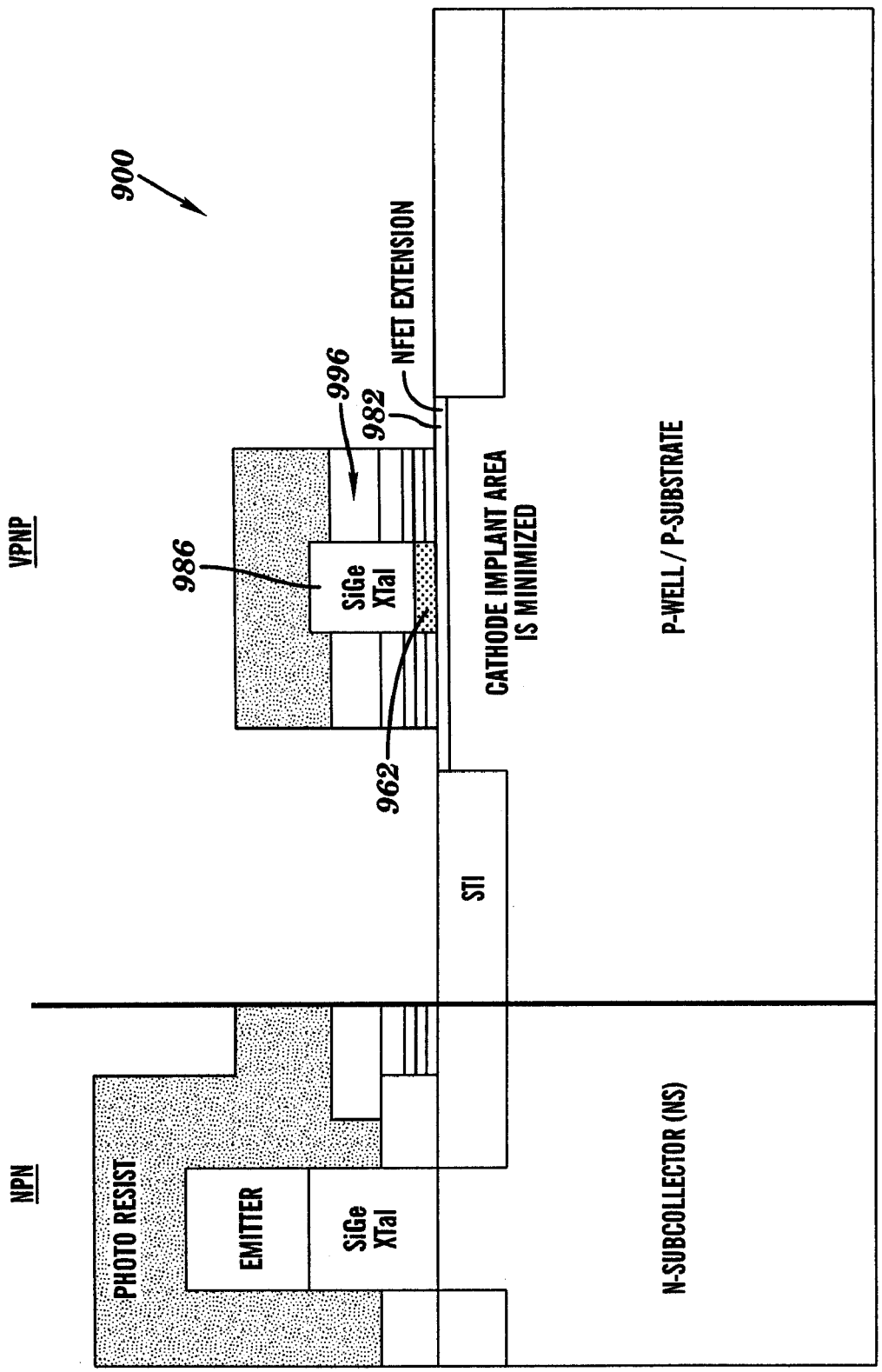

Turning to FIGS. 23-25, alternative embodiments of the above-described method will now be described. In these alternative embodiments, the step of forming n-type region 114 (FIG. 4) has been omitted. FIG. 23 shows a P-N diode 800 according to one embodiment of the invention. P-N diode 800 is similar to thyristor 602 (FIG. 16), except n-type region 114 is not present and reachthrough 130 is not required. Terminal 896 includes monocrystalline portion 886. FIG. 24 shows another P-N diode 804 according to one embodiment of the invention. In this case, P-N diode 804 is similar to thyristor 700 (FIG. 22), except n-type region 114 is not present and reachthrough 130 is not required. Compared to FIG. 23, P-N diode 804 includes a raised polycrystalline SiGe terminal (anode) 897 including polycrystalline SiGe semiconductor layer 888. Contacts 802 in the FIGS. 23-24 embodiments, allow for direct contact with n-type region (cathode) 152, and thus less parasitic resistance and capacitance. In addition, n-type region 152 implant size can be reduced.

FIG. 25 shows a PiN diode 900 that is substantially identical to P-N diode 800 (FIG. 23), except that an intrinsic silicon layer 962 between terminal 996 and an upper surface 982 of substrate 100 is provided, i.e., under a monocrystalline SiGe portion 986. A PiN diode having the structure of P-N diode 804 (FIG. 24) is also possible.

The above-described methods result in a variety of different P-N junction devices. In one embodiment, a vertical P-N junction device includes a first terminal (anode) including a semiconductor layer positioned above an upper surface of a substrate and a remaining structure positioned in the substrate, the first terminal positioned over an opening in an isolation region; and a second terminal positioned over the opening in the isolation region adjacent the first terminal. The terminal includes an anode and the second terminal contacts a cathode in the substrate. The first terminal may include monocrystalline silicon germanium or polycrystalline silicon germanium. Also, a semiconductor layer of the first terminal may be formed in the same layer as a base of an isolated NPN bipolar transistor. In another embodiment, a vertical P-N junction device may include a raised polycrystalline SiGe anode. In this case, the anode may be positioned over an opening in an isolation region in a substrate, and a cathode terminal positioned adjacent the anode over the opening in the isolation region. The vertical P-N junction devices may form a P-N diode, a PiN diode or a thyristor, as described above.

It should be recognized that the teachings of the above-described invention are equally applicable to silicon-on-insulator integration schemes.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a P-N junction device, the method comprising:

provididing a substrate having an opening through an isolation region;

implanting a first p-type region in the substrate through the opening;

forming a first n-type region in the opening;

forming a dielectric over all of the substrate including the first n-type region;

forming a polysilicon seed layer over the dielectric;

forming a terminal opening through a portion of the polysilicon seed layer and dielectric to an upper surface of the first n-type region;

growing a silicon germanium conductor layer in the terminal opening;

forming a second p-type region by doping the silicon germanium conductor layer p-type; and forming a terminal about the terminal opening, wherein the terminal includes an anode.

2. The method of claim 1, further comprising implanting a second n-type region into the substrate prior to implanting the first p-type region such that the P-N junction device includes a thyristor.

3. The method of claim 1, wherein the terminal opening is smaller than the isolation region opening.

4. The method of claim 1, wherein the terminal opening is larger than the isolation region opening.

5. The method of claim 1, wherein the terminal forming includes forming the terminal to have a size smaller than the isolation region opening, and further comprising forming a contact to the first n-type region adjacent to the terminal and within the isolation region opening.

6. The method of claim 1, wherein the silicon germanium conductor layer is monocrystalline.

7. The method of claim 1, wherein the terminal opening forming occurs prior to the forming of the polysilicon seed layer such that the polysilicon seed layer also enters the terminal opening, and the silicon germanium conductor layer is polycrystalline.

8. The method of claim 1, further comprising forming an intrinsic silicon layer between the terminal and the upper surface of the substrate.

9. The method of claim 1, wherein:

at least one of the P-N junction device forming acts occurs simultaneously with forming of a bipolar junction transistor (BJT); and at least one of the P-N junction device forming acts occurs simultaneously with forming of a complementary metal oxide semiconductor (CMOS) device.

10. The method of claim 9, wherein a base of the BJT and the silicon germanium conductor layer of the P-N junction device are the same layer.

\* \* \* \* \*